(12) United States Patent
Mochizuki et al.

(10) Patent No.: US 11,637,264 B2
(45) Date of Patent: Apr. 25, 2023

(54) ELECTRONIC DEVICE, MANUFACTURING METHOD OF THE SAME, ELECTRONIC APPARATUS, AND MOVING BODY

(71) Applicant: CANON KABUSHIKI KAISHA, Tokyo (JP)

(72) Inventors: Hiroyuki Mochizuki, Kanagawa (JP); Akira Okita, Kanagawa (JP); Tetsuo Takahashi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 52 days.

(21) Appl. No.: 17/210,725

(22) Filed: Mar. 24, 2021

(65) Prior Publication Data
US 2021/0305532 A1 Sep. 30, 2021

(30) Foreign Application Priority Data
Mar. 27, 2020 (JP) .............................. JP2020-058311

(51) Int. Cl.
*H01L 51/50* (2006.01)
*H01L 27/32* (2006.01)
*H01L 51/56* (2006.01)

(52) U.S. Cl.
CPC ...... *H01L 51/5056* (2013.01); *H01L 27/3234* (2013.01); *H01L 51/5004* (2013.01); *H01L 51/56* (2013.01)

(58) Field of Classification Search
CPC .......................... H01L 51/5056; H01L 51/502
See application file for complete search history.

(56) References Cited

U.S. PATENT DOCUMENTS

| | | | |
|---|---|---|---|
| 9,093,404 B2 | 7/2015 | Yokoyama et al. | |
| 9,698,365 B2 * | 7/2017 | Seo | H01L 51/504 |
| 10,734,455 B2 | 8/2020 | Kajimoto et al. | |
| 2002/0074935 A1 * | 6/2002 | Kwong | H01L 51/5016 313/504 |
| 2002/0086180 A1 * | 7/2002 | Seo | H01L 51/5012 428/917 |
| 2006/0194077 A1 * | 8/2006 | Noguchi | H01L 51/5012 428/917 |
| 2006/0251919 A1 * | 11/2006 | Aziz | H01L 51/5012 313/506 |

(Continued)

FOREIGN PATENT DOCUMENTS

JP 2014-123528 A 7/2014

*Primary Examiner* — Caleb E Henry
(74) *Attorney, Agent, or Firm* — Venable LLP

(57) ABSTRACT

Electronic device includes lower electrodes, insulating layer covering end portion of each lower electrode, organic compound layer covering the insulating layer and electrode region of upper surface of each lower electrode, and upper electrode covering the organic compound layer. The electrode region of the upper surface is located on inner side of the end portion The organic compound layer includes mixed layer containing first organic material and second organic material having hole mobility lower than that of the first organic material. The insulating layer includes inclined surface inclined with respect to the upper surface of the lower electrode. Ratio of weight of the second organic material to weight of the first organic material is higher in second portion of the mixed layer on the inclined surface than in first portion of the mixed layer on the electrode region.

16 Claims, 12 Drawing Sheets

(56) References Cited

U.S. PATENT DOCUMENTS

| | | | |
|---|---|---|---|
| 2008/0135804 A1* | 6/2008 | Qiu | H01L 51/5012 252/301.16 |
| 2010/0243991 A1* | 9/2010 | Nauka | H05B 33/20 257/E51.026 |
| 2010/0244673 A1* | 9/2010 | Nomura | H01L 51/007 313/504 |
| 2014/0175470 A1 | 6/2014 | Yokoyama et al. | |
| 2019/0198796 A1* | 6/2019 | Kim | H05B 33/20 |
| 2020/0381499 A1 | 12/2020 | Takahashi et al. | |

* cited by examiner

◄----- ORGANIC MATERIAL MOLECULES WHICH COME FLYING FROM VAPOR DEPOSITION SOURCE

◄----- ORGANIC MATERIAL MOLECULES WHICH COME FLYING FROM VAPOR DEPOSITION SOURCE

F I G. 10
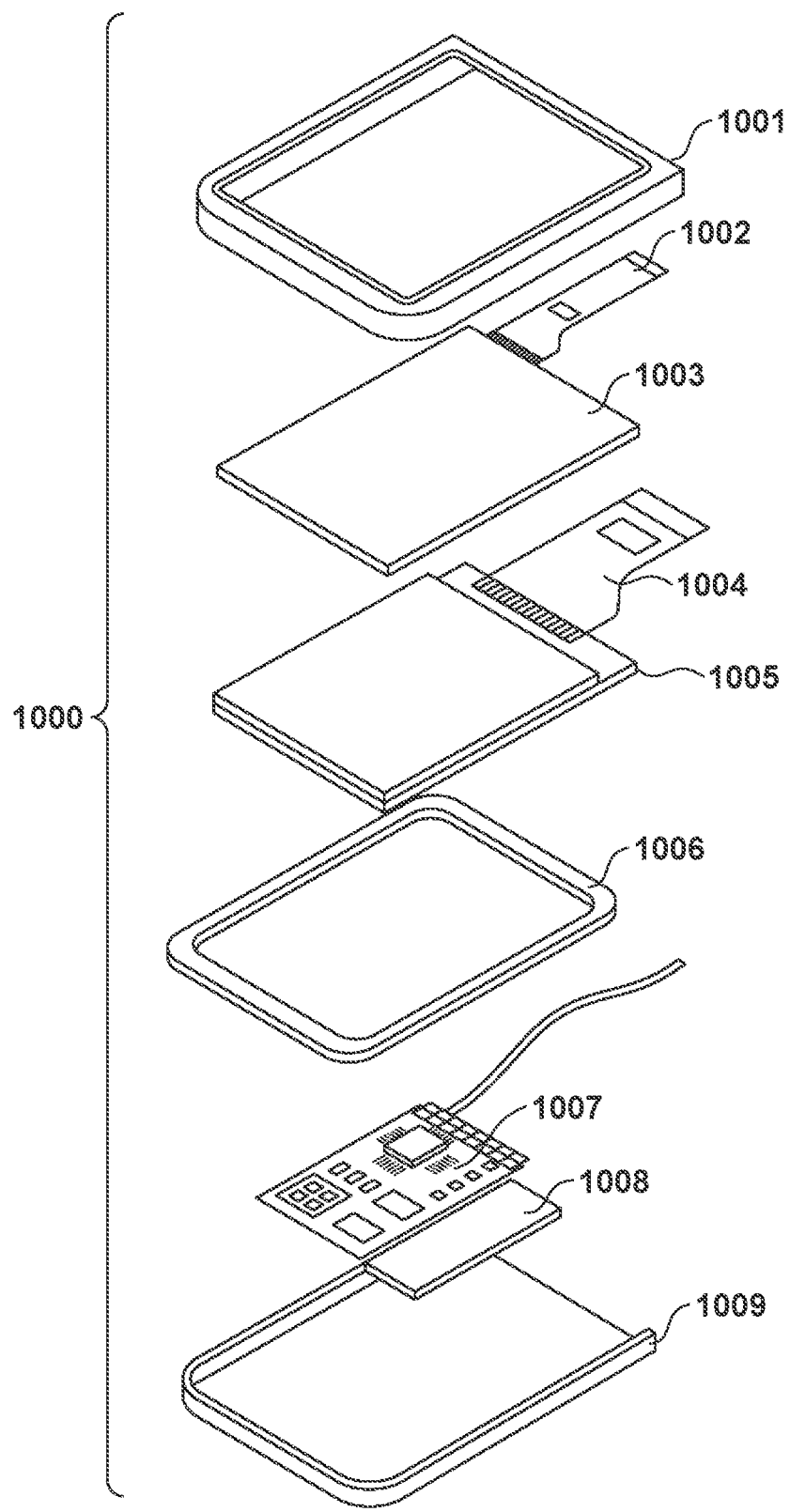

ELECTRONIC DEVICE, MANUFACTURING METHOD OF THE SAME, ELECTRONIC APPARATUS, AND MOVING BODY

BACKGROUND OF THE INVENTION

Field of the Invention

The present invention relates to an electronic device, a manufacturing method of the same, an electronic apparatus, and a moving body.

Description of the Related Art

An electronic device including a light emitting element or a photoelectronic conversion element has been proposed as an electronic device using an organic layer. A light emitting element is an element in which an organic layer is arranged between an upper electrode and a lower electrode, and emits light by exciting an organic compound contained in the organic layer. In recent years, apparatuses each including organic light emitting elements are receiving attention. In a semiconductor apparatus including organic light emitting elements, a plurality of the light emitting elements may share a common organic layer. In this arrangement, a leak current can be generated between the adjacent light emitting elements via the organic layer. The leak current between the adjacent light emitting elements can cause unintended light emission of the light emitting element. For example, if the electronic device is applied to a display device, unintended light emission narrows the color gamut that represents the expressive performance of the display device. Further, even in a single light emitting element, if it is desirable to cause a partial range of the continuous organic layer to emit light, the leak current causes unintended light emission. On the other hand, the thinner the organic layer, the less the leak current between the adjacent light emitting elements tends to be. However, the thinner the organic layer, the more a leak current between the upper electrode and the lower electrode is likely to be generated.

Japanese Patent Laid-Open No. 2014-123528 (hereinafter PTL 1) describes a light emitting apparatus that suppresses a leak current between light emitting elements of an organic light emitting element. The light emitting apparatus in PTL 1 includes first and second lower electrodes, a partition wall formed between the first lower electrode and the second lower electrode, an upper electrode arranged on the first and second lower electrodes, and a highly conductive layer and a light emitting layer arranged between each of the first and second lower electrode and the upper electrode. The highly conductive layer has a conductivity which is higher than that of the light emitting layer but lower than that of each of the first lower electrode, the second lower electrode, and the upper electrode. The partition wall includes a first slope located on the side of the first lower electrode, and a second slope located on the side of the second lower electrode. As for the total film thickness of the highly conductive layer and the light emitting layer sandwiched between the first lower electrode, the partition wall, and the second lower electrode and the upper electrode, the total film thickness in a direction perpendicular to the first slope is different from the total film thickness in a direction perpendicular to the second slope. That is, one of the total film thickness in the direction perpendicular to the first slope and the total film thickness in the direction perpendicular to the second slope is made smaller than the other one.

In the light emitting apparatus described in PTL 1, by decreasing the total film thickness in the direction perpendicular to the slope, resistance between the upper electrode and the lower electrode in the slope is decreased, and this can increase a leak current between the upper electrode and the lower electrode.

SUMMARY OF THE INVENTION

It is an object of the present invention to provide a technique advantageous in, in an electronic device including a plurality of lower electrodes, suppressing a leak current between an upper electrode and the lower electrode and suppressing a leak current between adjacent light emitting elements.

One of the aspect of the present invention provides an electronic device comprising a plurality of lower electrodes, an insulating layer covering an end portion of each of the plurality of lower electrodes, an organic compound layer covering the insulating layer and an electrode region of an upper surface of each of the plurality of lower electrodes, and an upper electrode covering the organic compound layer, the electrode region of the upper surface being located on an inner side of the end portion, wherein the organic compound layer includes a mixed layer, and the mixed layer contains a first organic material and a second organic material having a hole mobility lower than a hole mobility of the first organic material, the insulating layer includes an inclined surface inclined with respect to the upper surface of the lower electrode, and a ratio of a weight of the second organic material to a weight of the first organic material is higher in a second portion of the mixed layer on the inclined surface than in a first portion of the mixed layer on the electrode region.

BRIEF DESCRIPTION OF THE DRAWINGS

FIG. 10 is a schematic view showing an example of a display apparatus according to the embodiment;

DESCRIPTION OF THE EMBODIMENTS

Figure 1:
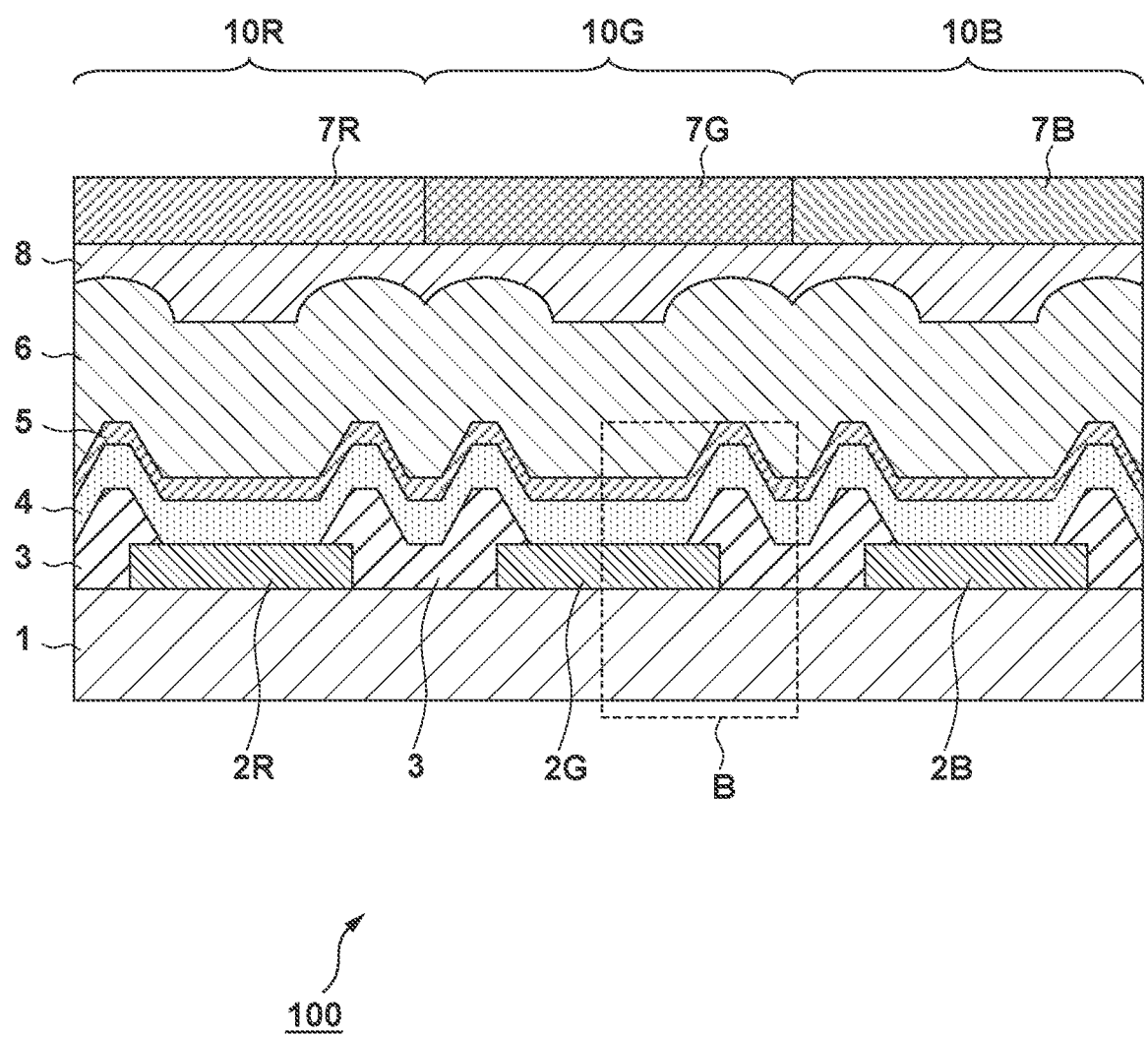
FIG. 1 is a sectional view schematically showing the arrangement of a light emitting device according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

An electronic device according to an embodiment is embodied as, for example, an organic light emitting device and, in this case, an organic layer can include, for example, a light emitting layer. Alternatively, an electronic device according to an embodiment is embodied as a photoelectronic conversion apparatus and, in this case, an organic layer can include, for example, a photoelectronic conversion layer.

First Embodiment

Figure 2:
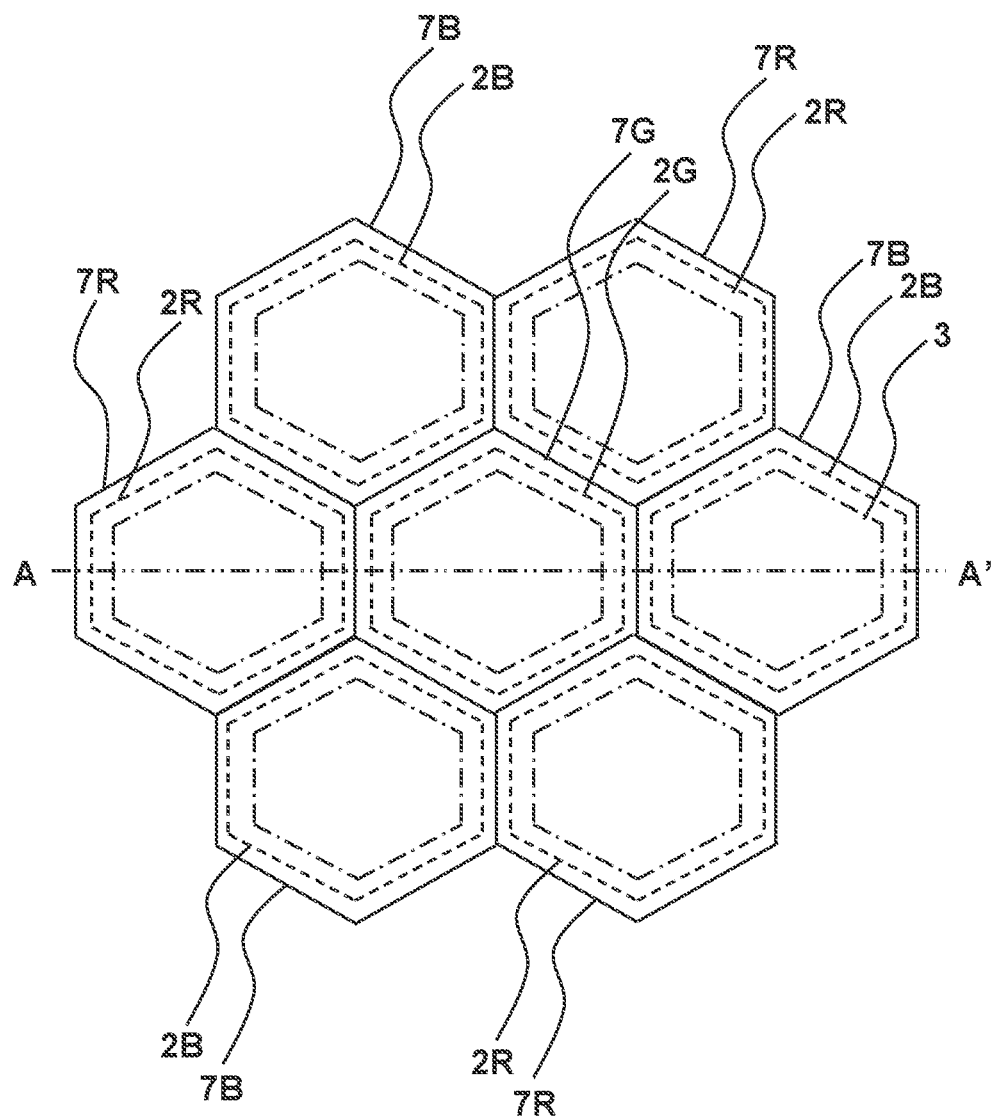
FIG. 2 is a plan view schematically showing the arrangement of a part of the light emitting device shown in FIG. 1.
Figure 3:
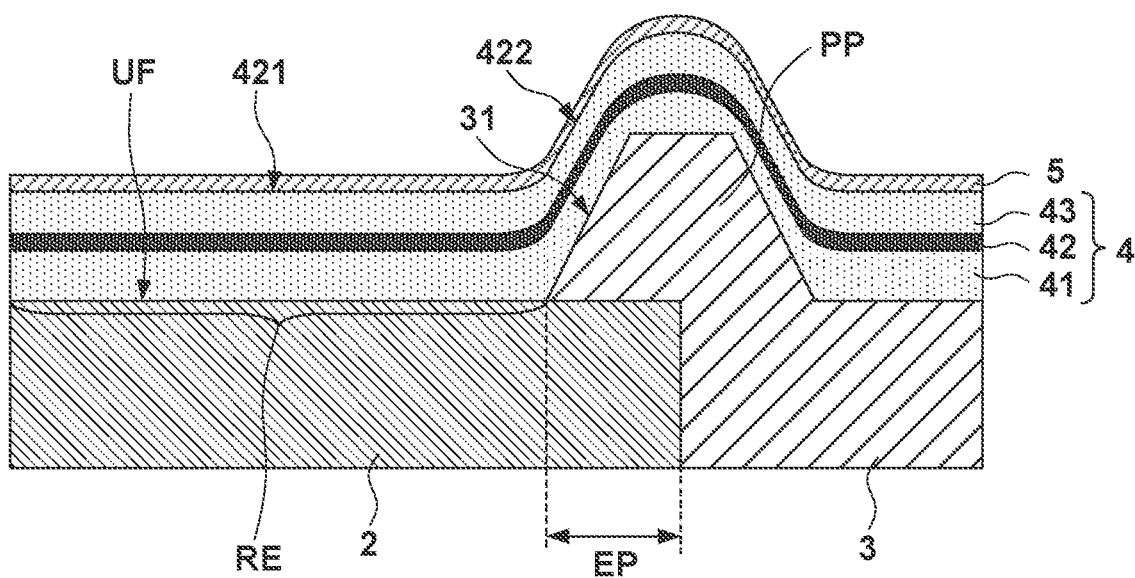
FIG. 3 is a sectional view schematically showing the arrangement of a part of the light emitting device according to the first embodiment.

An electronic device according to the first embodiment is formed as a light emitting device. FIG. 1 is a schematic sectional view of a part of a light emitting device 100 according to the first embodiment. FIG. 2 is a top bird's-eye view of a part of the light emitting device 100. FIG. 3 is an enlarged view of a dotted line portion B in FIG. 1. A section taken along a line A-A' in FIG. 2 corresponds to FIG. 1.

In this embodiment, an example will be shown in which three elements 10 form one pixel (main pixel). An example of delta-arrayed pixels will be shown in this embodiment, but the present invention is not limited to this, and another array such as a stripe array, a square array, or the like may be used.

The light emitting device 100 includes an element substrate 1 including a surface formed from an insulator, and a plurality of the light emitting elements 10 arranged on the element substrate 1. FIG. 1 shows three light emitting elements 10R, 10G, and 10B among the plurality of the light emitting elements 10 included in the light emitting device 100. "R" of reference numeral 10R indicates that the element emits red light. Similarly, "G" of reference numeral 10G indicates that the element emits green light, and "B" of reference numeral 10B indicates that the element emits blue light. In this specification, when a specific light emitting element among the plurality of the light emitting elements 10 is indicated, a suffix is added after the reference numeral such as the light emitting element "10R". When indicating any of the light emitting elements, it is simply indicated as the light emitting element "10". This also applies to other components.

The light emitting device 100 can include a plurality of lower electrodes 2 arranged on the element substrate 1 (insulator), and an insulating layer 3 arranged on the element substrate 1 so as to cover end portions EP of each of the plurality of lower electrodes 2. The light emitting device 100 can further include an organic compound layer 4 covering the insulating layer 3 and an electrode region RE of the upper surface of each of the plurality of lower electrodes 2, the electrode region RE being located on the inner side of the end portion EP, and an upper electrode 5 covering the organic compound layer 4. The lower electrodes 2 are separated from each other for each light emitting element by the insulating layer 3.

The light emitting device 100 can be formed as a top emission device that extracts light from the upper electrode 5, but the present invention is not limited to this. In addition to the components described above, the light emitting device 100 can include a protective layer 6 arranged so as to cover the upper electrode 5, and a plurality of color filters 7 arranged on the protective layer 6 so as to respectively correspond to the plurality of light emitting elements 10. The light emitting device 100 can further include a planarizing layer 8 between the protective layer 6 and the color filters 7 to form a flat surface on the unevenness which can exist in the upper surface of the protective layer 6. The planarizing layer 8 can be formed from an organic compound. The organic compound may be a low-molecular material or a polymeric material, but is preferably a polymeric material. The planarizing layers 8 may be provided above and below the color filters 7, and the same or different constituent materials may be used for them. The planarizing layer 8 may be formed from polyvinyl carbazole resin, polycarbonate resin, polyester resin, ABS resin, acrylic resin, polyimide resin, phenol resin, epoxy resin, silicone resin, urea resin, and the like.

In this specification, "upper" and "lower" indicate the upper and lower directions, respectively, in FIG. 1. Of two principal surfaces of the element substrate 1, the surface on which the lower electrodes 2 and the like are arranged is referred to as the upper surface of the element substrate 1. The surface of the lower electrode 2 on the side of the element substrate 1 is referred to as the lower surface of the lower electrode 2. Here, the lower surface of the lower electrode 2 can be a surface in contact with a surface (for example, an upper surface of an interlayer insulating layer) formed from an insulator and forming the uppermost surface of the element substrate 1. Therefore, for example, if a plug or the like for connecting to another wiring is connected to the lower surface of the lower electrode 2, almost a flat portion excluding the portion with the plug or the like can be the lower surface of the lower electrode 2.

Although not shown in FIG. 1, the element substrate 1 may include a driving circuit including a transistor connected to the lower electrode 2, a wiring, a plug, and an interlayer insulating layer, and the uppermost surface (the surface in contact with the lower electrode 2) can be formed by the interlayer insulating layer. For example, the interlayer insulating layer may be formed from an inorganic substance such as silicon oxide or silicon nitride, or may be formed from an organic substance such as polyimide or polyacryl. Since the organic compound layer may be deteriorated by moisture, from the viewpoint of suppressing permeation of moisture, the interlayer insulating layer is preferably formed from an inorganic material. The interlayer insulating layer is sometimes referred to as a planarizing layer since it is used to decrease the unevenness in the surface on which the lower electrodes 2 are formed.

A metal material having a reflectance of 80% or more with respect to the light emission wavelength of the organic compound layer 4 may be used for the lower electrode 2. The lower electrode 2 can be formed from, for example, a metal such as Al or Ag, or an alloy obtained by adding Si, Cu, Ni, Nd, or the like to a metal. Here, the light emission wavelength refers to the spectral range of light emitted from the organic compound layer 4. If the reflectance of the lower electrode 2 with respect to the light emission wavelength of the organic compound layer 4 is high, the lower electrode 2 may have a stacked structure including a barrier layer. As the material of the barrier layer, a metal such as Ti, W, Mo, or Au, or an alloy thereof may be used. The barrier layer may be a metal layer arranged on an upper surface UF of the lower electrode 2.

The insulating layer 3 can be arranged between the lower electrode 2 and the organic compound layer 4 while covering the end portion EP of the lower electrode 2. The end portion EP of the lower electrode 2 can include a peripheral portion of the upper surface UF of the lower electrode 2 and a side surface of the lower electrode 2. The end portion EP of the lower electrode 2 can be covered by the insulating layer 3. The electrode region RE of the lower electrode 2 is not covered by the insulating layer 3 but can be covered by the organic compound layer 4. The electrode region RE can be a region where an electric charge is injected into the organic compound layer 4. The electrode region RE of the lower electrode 2 can be in contact with the organic compound layer 4 (hole transport layer 41). The electrode region RE can overlap an opening of the insulating layer 3 in orthogonal projection (planar view) to the lower surface of the lower electrode 2. In the planar view, the electrode region RE can be a light emitting region of the light emitting element 10. That is, the shape of the electrode region RE when viewed from above can be defined by the opening of the insulating layer 3. The insulating layer 3 is only required to have a function of separating the lower electrodes 2 of the respective light emitting elements 10 from each other and a function of defining the light emitting region (electrode region), and the shape thereof is not limited to the shape as shown in FIG. 1.

The insulating layer 3 can include inclined surfaces 31 each inclined with respect to the upper surface UF of the lower electrode 2. The inclined surface 31 can be inclined so as to decrease in height toward the upper surface UF of the lower electrode 2. The inclined surface 31 may include a flat portion, or may be formed of a curved surface alone. Any details of the angle, number of steps, height, and the like of the inclined surface 31 can be set as long as they give a shape that does not lose the function as the light emitting device. The insulating layer 3 can further include a flat portion 421 above the electrode region RE.

The insulating layer 3 can be formed by, for example, a vapor deposition method such as a chemical vapor deposition method (CVD method) or a physical vapor deposition method (PVD method). The insulating layer 3 can be formed of, for example, silicon nitride (SiN), silicon oxynitride (SiON), silicon oxide (SiO), or the like. Alternatively, the insulating layer 3 may be a stacked film formed by films made of the substances described above. The inclination angle of the inclined surface 31 of the insulating layer 3 can be controlled by conditions of anisotropic etching or isotropic etching. The inclination angle of the inclined surface 31 can be evaluated by, for example, an average height of highest height and lowest height of the upper surface of the insulating layer 3. The highest height and the lowest height can be evaluated using, for example, the lower surface or the upper surface of the lower electrode 2 as a reference.

The inclination angle of the inclined surface 31 may be controlled by, for example, controlling the inclination angle of the layer immediately below the insulating layer 3. For example, by forming, in the interlayer insulating layer forming the uppermost surface of the element substrate 1, a concave portion including an inclined side surface and controlling the inclined angle of the side surface, the inclination angle of the inclined surface 31 of the insulating layer 3 can be controlled. The insulating layer 3 may have an unevenness in the upper surface generated by processing such as etching, or layer stacking.

The organic compound layer 4 can be arranged below the upper electrode 5 so as to cover the electrode region RE of the upper surface UF of each of the plurality of lower electrodes 2 and the insulating layer 3. The organic compound layer 4 can be shared by the plurality of lower electrodes 2 and, from another point of view, by the plurality of elements 10. For example, the organic compound layer 4 can be shared by all the elements 10 forming the light emitting device 100. In other words, the organic compound layer 4 can be arranged over the entire area of the display region of the light emitting device 100.

In an example, the organic compound layer 4 can include the hole transport layer 41, a mixed layer 42, and an electron transport layer 43. The material forming each layer of the organic compound layer 4 can be selected from the viewpoints of light irradiation efficiency, drive life, optical interference, and the like. The hole transport layer 41 may function as an electron blocking layer or a hole injection layer, or may have a stacked structure formed by a plurality of layers such as a hole injection layer, a hole transport layer, an electron blocking layer, and the like. The mixed layer 42 can function as a light emitting layer. The mixed layer 42 may have a stacked structure formed by a plurality of layers that emit light of different colors, or may be a layer in which light emitting dopants that emit light of different colors are mixed. The electron transport layer 43 may function as a hole blocking layer or an electron injection layer, or may have a stacked structure formed by a plurality of layers such as an electron injection layer, an electron transport layer, a hole blocking layer, and the like. The hole transport layer 41 and/or the electron transport layer 43 may include a mixed layer in which a plurality of organic materials are mixed.

The mixed layer 42 may include a plurality of light emitting layers and an intermediate layer arranged between the plurality of light emitting layers, and have a tandem structure in which the intermediate layer is an electric charge generating layer. The tandem structure may include an electric charge transport layer such as a hole transport layer or an electron transport layer between the electric charge generating layer and the light emitting layer. The electric charge generating layer can be a layer that contains an electron donating material and an electron accepting material and generates an electric charge. The electron donating material is a material that donates an electron, and the electron accepting material is a material that accepts an electron. Thus, a positive electric charge and a negative electric charge are generated in the electric charge generating layer, so that it is possible to supply the positive electric charge or the negative electric charge to each layer above or below the electric charge generating layer. The electron donating material may be, for example, an alkali metal such as lithium or cesium. Further, the electron donating material may be, for example, lithium fluoride, a lithium complex, cesium carbonate, or a cesium complex. In this case, the electron donating property may be exhibited by being contained together with a reducible material such as aluminum, magnesium, or calcium. The electron accepting material may be, for example, an inorganic substance such as molybdenum oxide, or an organic substance such as [Dipyrazino [2,3-f:2',3'-h]quinoxaline-2,3,6,7,10,11-hexacarbonitrile]. In the mixed layer 42, the electron receiving material and the electron donating material may be mixed or stacked.

The upper electrode 5 can be arranged on the organic compound layer 4. The upper electrode 5 is continuously formed above the plurality of light emitting elements 10, and can be shared by the plurality of light emitting elements 10. Similar to the organic compound layer 4, the upper electrode 5 can be arranged over the entire area of the display region of the light emitting device 100. The upper electrode 5 may be an electrode that transmits at least part of light having reached the lower surface of the upper electrode 5. The upper electrode 5 may function as a semi-transmissive reflective layer that transmits part of light and reflects the other part of light (that is, a layer having semi-transmissive reflectivity). The upper electrode 5 can be formed of, for example, a metal such as magnesium or silver, an alloy containing magnesium or silver as a main component, or an alloy material containing an alkali metal or an alkaline earth metal. An oxide conductor or the like may be used as the upper electrode 5. The upper electrode 5 may have a stacked structure as long as it has appropriate transmittivity.

The protective layer 6 can be formed from, for example a material having low permeability to oxygen and moisture from the outside, such as silicon nitride, silicon oxynitride, aluminum oxide, silicon oxide, and titanium oxide. Silicon nitride and silicon oxynitride can be formed using, for example, a CVD method. On the other hand, aluminum oxide, silicon oxide, and titanium oxide can be formed using an atomic layer deposition method (ALD method).

The constituent material and manufacturing method of the protective layer 6 are not limited to those exemplified above, and may be determined in consideration of the thickness of the layer to be formed, and a time required for forming the layer. The protective layer 6 may have a single-layer structure or a stacked structure as long as it transmits light transmitted through the upper electrode 5 and has sufficient moisture blocking performance. The color filter 7 can be arranged on the protective layer 6. Like the color filter 7R and the color filter 7G shown in FIG. 1, the color filters 7 adjacent to each other may contact each other without a gap. Further, the color filters of different colors may be arranged so as to overlap each other.

As exemplified in FIG. 3, the insulating layer 3 may be arranged such that a part thereof extends over the end portion EP of the lower electrode 2, and this can form a protruding portion PP protruding upward (in a direction away from the lower surface of the lower electrode 2) in the insulating layer 3. The protruding portion PP can include the inclined surface 31 inclined with respect to the electrode region RE of the lower electrode 2. The inclined surface 31 can be inclined so as to decrease in height toward the upper surface UF of the lower electrode 2. Since such the inclined surface 31 or the protruding portion PP exists, the organic compound layer 4 covering the electrode region RE and the insulating layer 3 can include the flat portion (first portion) 421 located on the electrode region RE, and an inclined portion (second portion) 422 located on the inclined surface 31.

The mixed layer 42 can contain a first organic material and a second organic material having a hole mobility lower than that of the first organic material. The mixed layer 42 can be a layer obtained by mixing the first organic material and the second organic material. The mixed layer 42 may contain one or more organic materials different from the first organic material and the second organic material. The ratio of the weight of the second organic material to the weight of the first organic material is preferably higher in the inclined portion (second portion) 422 of the mixed layer 42 on the inclined surface 31 than in the flat portion (first portion) 421 of the mixed layer 42 on the electrode region RE. This will be referred to as a weight ratio condition in the following description. Note that as long as the weight ratio condition is satisfied, the weight of the second organic material may be larger than the weight of the first organic material in the inclined portion.

Accordingly, in the inclined portion (second portion) 422 of the mixed layer 42, movement of holes via the mixed layer 42 is suppressed. As a result, movement of holes via the organic compound layer 4 is suppressed between the lower electrode 2R and the lower electrode 2G, between the lower electrode 2R and the lower electrode 2B, and between the lower electrode 2B and the lower electrode 2G. That is, a leak current between the adjacent light emitting elements 10 is suppressed. Thus, it is unnecessary to decrease the thickness of the inclined portion 422 of the organic compound layer 4 covering the insulating layer 3 (inclined surface 31) to suppress a leak current between the adjacent light emitting elements 10. This suppresses a disadvantage of decreasing the thickness of the inclined portion 422 of the organic compound layer 4 covering the insulating layer 3 (inclined surface 31), that is, a leak current between the upper electrode 5 and the lower electrode 2 that tends to occur as the resistance between the upper electrode 5 and the lower electrode 2 decreases. On the other hand, in the flat portion (first portion) 421 on the electrode region RE (light emitting region), movement of holes between the lower electrode 2 and the upper electrode 5 becomes easy. Therefore, a voltage to be applied between the lower electrode 2 and the upper electrode 5 to cause the light emitting element 10 to emit light can be decreased.

The mixed layer 42 as described above may be applied to the hole transport layer 41. Since the hole transport layer 41 is responsible for hole injection into the light emitting layer, the hole mobility of the hole transport layer 41 is generally high in the organic compound layer 4. However, according to the mixed layer 42 in this embodiment, movement of holes in the inclined portion (second portion) 422 is suppressed. Accordingly, in the inclined portion (second portion) 422 of the mixed layer 42 forming the hole transport layer, movement of holes via the mixed layer 42 is suppressed. As a result, movement of holes via the organic compound layer 4 is suppressed between the lower electrode 2R and the lower electrode 2G, between the lower electrode 2R and the lower electrode 2B, and between the lower electrode 2B and the lower electrode 2G. That is, a leak current between the adjacent light emitting elements 10 is suppressed.

The mixed layer 42 can be, for example, a co-vapor-deposited layer formed by co-vapor-deposition or vapor phase co-deposition. For example, by using a vapor deposition apparatus as exemplified in FIG. 4, it is possible to perform co-vapor-deposition using two organic materials having hole mobilities different from each other. The vapor deposition apparatus exemplified in FIG. 4 can include, in a chamber, a first vapor deposition source 201 that supplies the first organic material, and a second vapor deposition source 202 that supplies the second organic material. Here, as for a light emitting element 204 arranged on a substrate 203, a manufacturing condition for satisfying the weight ratio condition will be considered. Let h1 be the vertical distance between the first vapor deposition source 201 that supplies the first organic material and the light emitting element 204 arranged on the substrate 203, and let h2 be the vertical distance between the second vapor deposition source 202 that supplies the second organic material and the light emitting element 204 arranged on the substrate 203. In this case, if h1>h2 is satisfied, the weight ratio condition can be satisfied. This will be described with reference to FIG. 5.

Figure 5A:
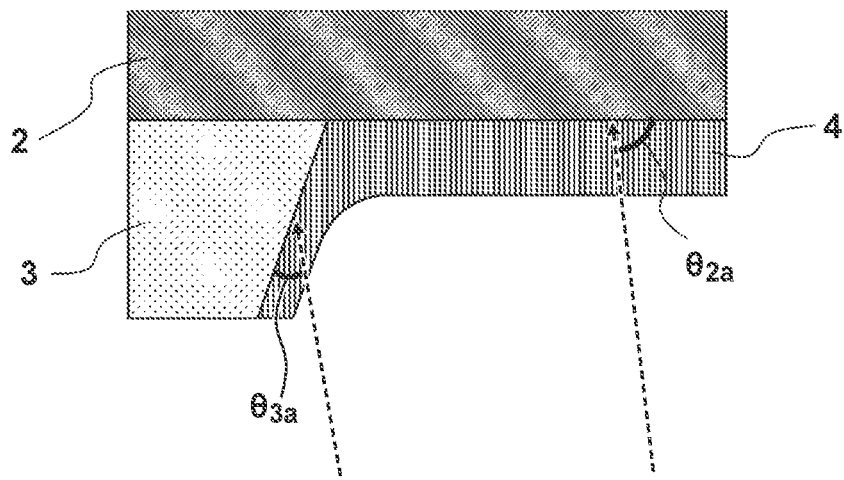
FIGS. 5A and 5B are views for explaining a manufacturing method of an electronic device according to the first embodiment.

Here, it is assumed that a thickest film is formed when the organic material molecules used for vapor deposition vertically fall on the vapor deposition target surface. In FIG. 5, the vertical relationship is reversed from that in FIG. 1. If the vertical distance between the light emitting element 204 arranged on the substrate 203 and the vapor deposition source is large, as shown in FIG. 5A, an incident angle θ3a of the organic material molecules with respect to the inclined surface 31 of the insulating layer 3 is decreased, and a thin organic compound film is formed on the inclined surface 31 of the insulating layer 3. Here, the incident angle is an angle formed by the surface on which the organic material molecules fall and the direction in which the organic material molecules come flying. If the vertical distance between the light emitting element 204 arranged on the substrate 203 and the vapor deposition source is large, an incident angle θ2a of the organic material molecules with respect to the electrode region RE becomes close to a perpendicular angle, and a thick organic compound film is formed on the electrode region RE.

Figure 5B:
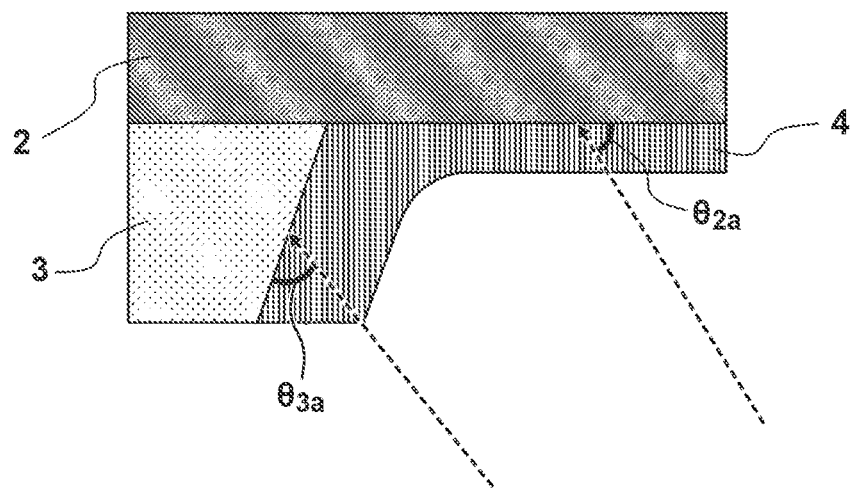

On the other hand, if the vertical distance between the light emitting element 204 arranged on the substrate 203 and the vapor deposition source is small, as shown in FIG. 5B, an incident angle θ3b of the organic material molecules with respect to the inclined surface 31 of the insulating layer 3 becomes close to a perpendicular angle, and a thick organic compound film is formed on the inclined surface 31 of the insulating layer 3. Further, if the vertical distance between the light emitting element 204 arranged on the substrate 203 and the vapor deposition source is small, an incident angle θ2b of the organic material molecules with respect to the electrode region RE is decreased, and a thin organic compound film is formed on the electrode region RE.

Figure 4:
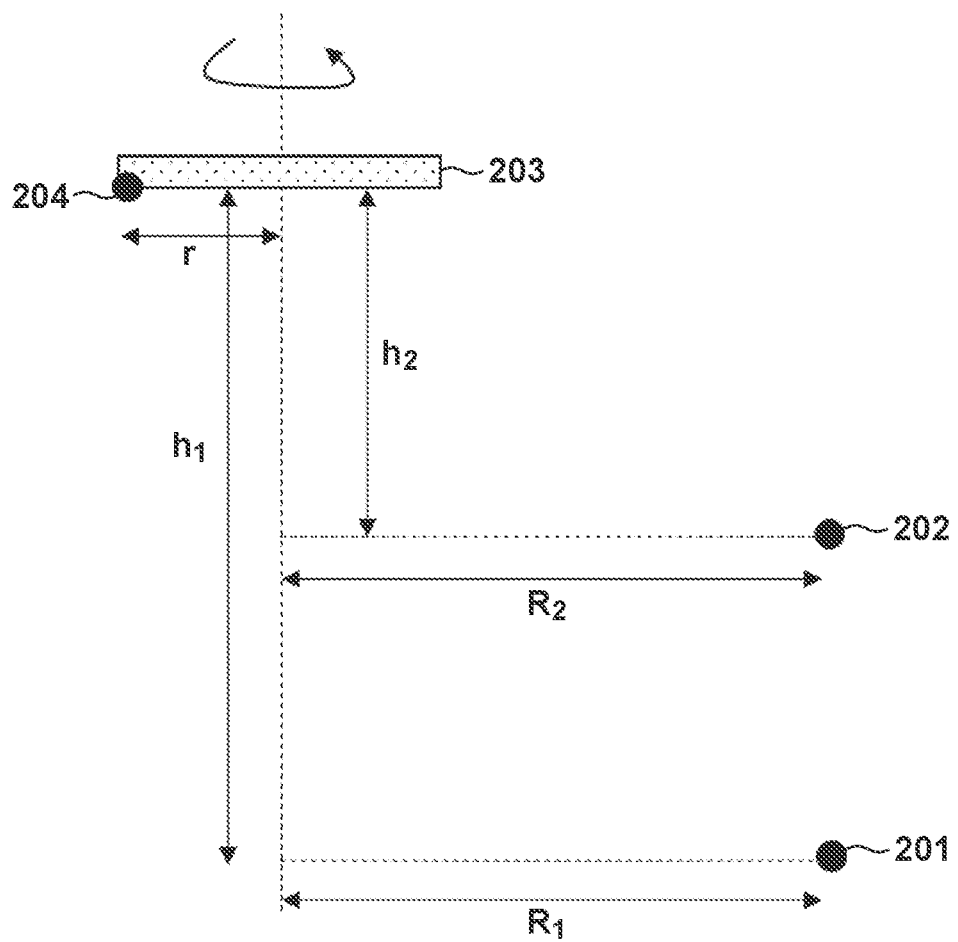
FIG. 4 is a view schematically showing the arrangement of a vapor deposition apparatus.

Thus, by using the vapor deposition apparatus in which h1>h2 is satisfied, a light emitting device that satisfies the weight ratio condition can be manufactured. In order to support this, a vapor deposition simulation was performed using the vapor deposition method. In FIG. 4, as an example, R1=210 mm, R2=210 mm, r=16 mm, h1=510 mm, and h2=100 mm were set, and the angle formed by the inclined surface 31 and the lower electrode 2 was set to be 50°.

By the vapor deposition simulation, in the flat portion (first portion) 421 of the mixed layer 42 on the electrode region RE, the ratio of the weight of the first organic material to the weight of the second organic material is 2:1. Further, by the vapor deposition simulation, in the inclined portion (second portion) 422 of the mixed layer 42 on the inclined surface 31, the ratio of the weight of the first organic material to the weight of the second organic material is 11:9. Accordingly, it has been confirmed that the ratio of the weight of the second organic material to the weight of the first organic material is higher in the inclined portion (second portion) 422 of the mixed layer 42 on the inclined surface 31 (=9/11) than in the flat portion (first portion) 421 of the mixed layer 42 on the electrode region RE (=1/2). Here, as for the flat portion (first portion) 421, the ratio of the weight of the first organic material to the weight of the second organic material per unit area of the electrode region RE in a planar view was evaluated. As for the inclined portion (second portion) 422, the ratio of the weight of the first organic material to the weight of the second organic material per unit area of the inclined surface 31 in a planar view was evaluated.

In a case in which h1>h2 is satisfied, it is preferable that the second vapor deposition source 202 that supplies the second organic material is not located immediately above the first vapor deposition source 201 that supplies the first organic material. This is because if the second vapor deposition source 202 exists immediately above the first vapor deposition source 201, the second vapor deposition source 202 disturbs the organic material molecules from the first vapor deposition source 201, so that it can be difficult for the organic material to be vapor-deposited on the light emitting element 204.

Further, in the case in which h1>h2 is satisfied, it is preferable that a horizontal distance R1 between the first vapor deposition source 201 that supplies the first organic material and the center of the substrate 203 is different from a horizontal distance R2 between the second vapor deposition source 202 that supplies the second organic material and the center of the substrate 203. By appropriately selecting the horizontal distance between each vapor deposition source and the substrate and arranging the first vapor deposition source 201 such that, for example, the incident angle θ of the organic material molecules with respect to the inclined surface 31 of the insulating layer 3 is set small, the thickness of the organic compound layer formed on the inclined surface 31 of the insulating layer 3 is decreased. In addition, by arranging the second vapor deposition source 202 such that the incident angle θ of the organic material molecules with respect to the inclined surface 31 of the insulating layer 3 is set close to the perpendicular angle, the thickness of the organic compound layer formed on the inclined surface 31 of the insulating layer 3 is increased. Therefore, the ratio of the weight of the second organic material to the weight of the first organic material can be sufficiently higher in the incline portion 422 of the mixed layer 42 on the inclined surface 31 than in the flat portion 421 of the mixed layer 42 on the electrode region RE.

As long as the mixed layer 42 can be formed so as to satisfy the weight ratio condition, the vapor deposition apparatus to be used may not be the vapor deposition apparatus exemplified in FIG. 4.

A manufacturing method of the light emitting device 100 (electronic device) according to this embodiment can include a step of forming the mixed layer 42 using the vapor deposition apparatus exemplified in FIG. 4. In another aspect, the mixed layer 42 of the light emitting device 100 can be formed using the vapor deposition apparatus exemplified in FIG. 4. The manufacturing method of the light emitting device 100 can include a first step and a second step. In the first step, a structure including the plurality of lower electrodes 2 arranged on the substrate 1 and the insulating layer 3 covering the end portions EP of each of the plurality of lower electrodes 2 is prepared. In the second step, an organic compound layer is formed that covers the insulating layer 3 and the electrode region RE of the upper surface of each of the plurality of lower electrodes 2, the electrode region RE being located on the inner side of the end portion EP. In the second step, first, the structure prepared in the first step can be arranged in the chamber of the vapor deposition apparatus exemplified in FIG. 4. In the second step, subsequently, the mixed layer 42 can be formed by co-vapor-deposition using the first vapor deposition source 201 and the second vapor deposition source 202.

In the inclined portion 422 of the mixed layer 42, it is preferable that the HOMO (Highest Occupied Molecular Orbital) level of the second organic material is lower than the HOMO level of the first organic material. In this case, since an effect of trapping electric charges is obtained in the inclined portion 422 of the mixed layer 42 and movement of holes in the inclined portion 422 is restricted, the effect of suppressing a leak current between the adjacent light emitting elements is improved.

Figure 6:
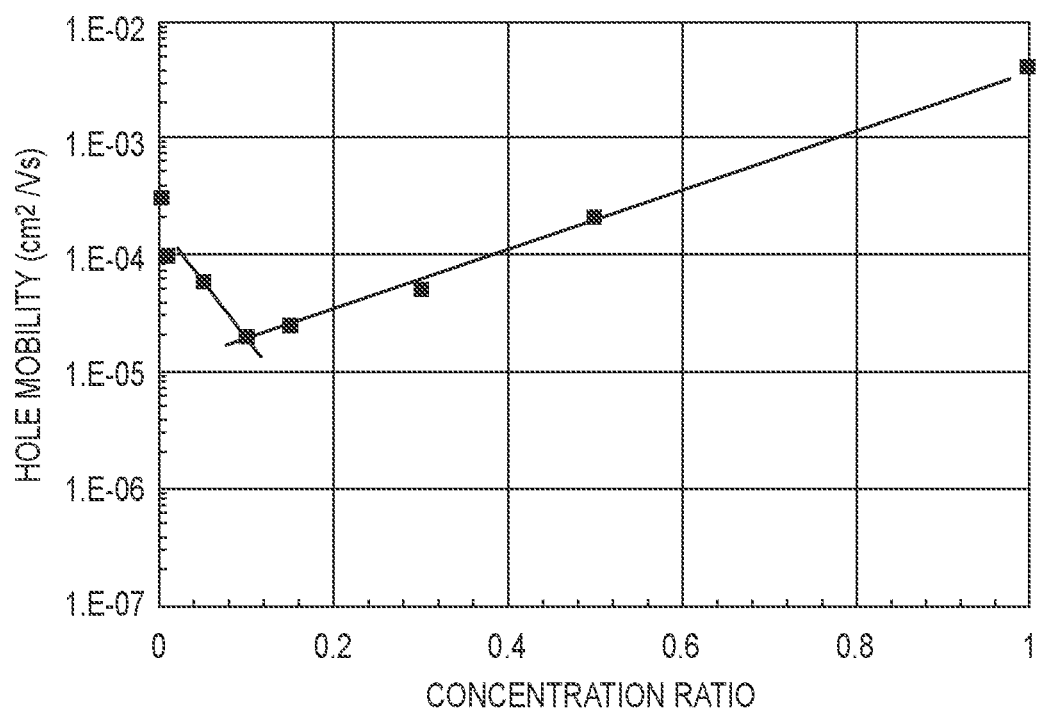
FIG. 6 is a graph showing measured results of the hole mobility in a mixed layer formed from compound 1 and compound 2.

The percent concentration of mass of the first organic material in the inclined portion 422 is preferably 1% or more and 30% or less. FIG. 6 shows results obtained by measuring the hole mobility in a mixed layer formed from compound 1 and compound 2 described below by a TOF (Time Of Flight) method.

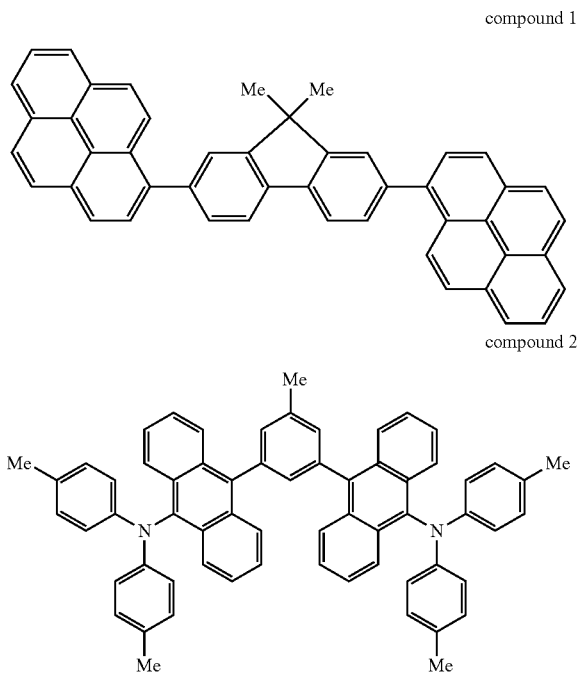

compound 1 compound 2

A TOF measuring device (TOF-301 manufactured by Optel cooperation) was used for the measurement. Samples for measurement were used, each of which was obtained by forming, by a vacuum vapor deposition method, a mixed thin film formed from compound 1 and compound 2 having a film thickness of 2 μm to 4 μm, and depositing aluminum as a counter electrode on the thin film. The abscissa represents the percent concentration of mass of compound 2 in the mixed layer, and the ordinate represents the hole mobility at an electric field intensity of 36 kV/cm. The ionization potentials of compound 1 and compound 2 are 5.70 eV and 5.49 eV, respectively. It can be seen that the hole mobility in a case in which compound 2 is mixed at 1 wt % to 30 wt % is lower than the hole mobility of the thin film containing only compound 1. In addition, it can be seen that in a case in which compound 2 is mixed at 10 wt %, the hole mobility is lowest and the effect of compound 2 trapping electric charges is strong. Thus, in the inclined portion 422 of the mixed layer 42, if the percent concentration of mass of the first organic material falls within a range between 1 wt % and 30 wt %, as shown in FIG. 6, the hole mobility is lower than in a case in which the first organic material is singly used. Further, if the percent concentration of mass of the first organic material falls within a range between 1 wt % and 30 wt %, the effect of trapping electric charges is large, so that it is difficult for the holes to move in the inclined portion 422. Therefore, it is possible to obtain the large effect of suppressing a leak current between the adjacent light emitting elements.

In the inclined portion 422 of the mixed layer 42, it is preferable that the difference between the HOMO level of the first organic material and the HOMO level of the second organic material satisfies the relationship described below. That is, it is preferable that the HOMO level of the first organic material is higher than the HOMO level of the second organic material, and the difference between the HOMO level of the first organic material and the HOMO level of the second organic material is equal to or larger than 0.15 eV.

The HOMO level of the first organic material—the HOMO level of the second organic material ≥0.15 eV.

Figure 7:
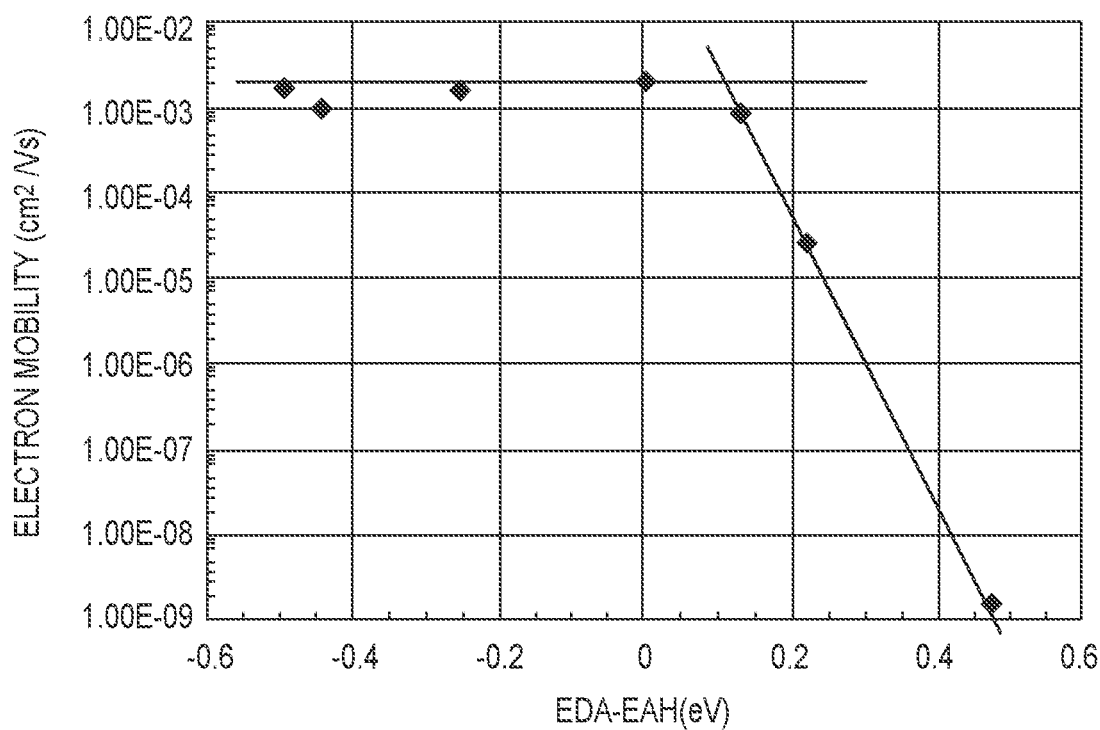
FIG. 7 is a graph showing measured results of the hole mobility in a mixed film obtained by mixing dopants having different electron affinities.

FIG. 7 shows results obtained by measuring samples by the TOF method and measuring the electric charge mobility thereof. The samples were obtained by mixing various kinds of materials, each serving as a dopant, having different electron affinities at a concentration of 10 wt % with the above-described compound 1 serving as a host. The abscissa represents the difference (EAD−EAH) between the electron affinity of the dopant (EAD) and the electron affinity of compound 1 (EAH), and the ordinate represents the electric charge mobility at an electric field intensity of 36 kV/cm. Note that in FIG. 7, the plot at EAD−EAH=0 indicates the electric charge mobility of the host. If the difference in electron affinity is equal to or larger than 0.15 eV, it can be seen that the electric charge mobility is decreased significantly (to ⅕ or less) and the effect of trapping electric charges is working. Thus, if the difference between the HOMO level of the first organic material and the HOMO level of the second organic material is equal to or larger than 0.15 eV, the electric charge mobility is decreased and the effect of trapping electric charges become large. Accordingly, it becomes difficult for holes to move in the inclined portion 422 of the mixed layer 42, and it is possible to obtain the larger effect of suppressing a leak current between the adjacent light emitting elements.

Second Embodiment

Figure 8:
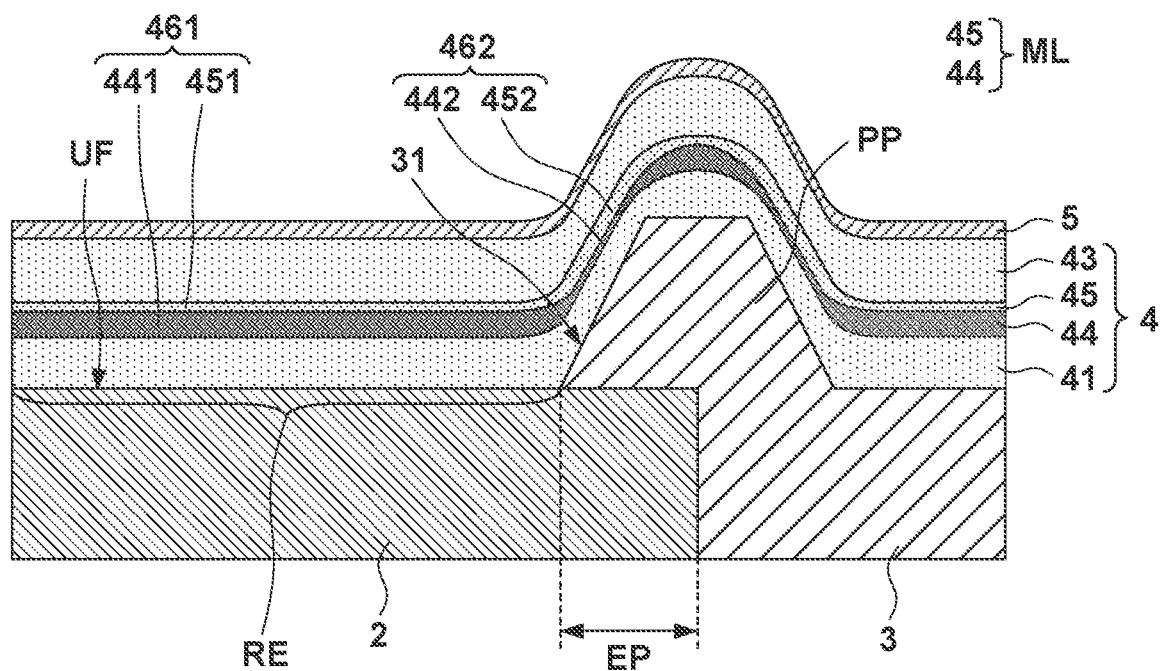
FIG. 8 is a sectional view schematically showing the arrangement of a part of a light emitting device according to the second embodiment.

The second embodiment will be described below. Matters not mentioned as the second embodiment can follow the first embodiment. In the second embodiment, a mixed layer ML can include two organic material layers (a first organic material layer 44 and a second organic material layer 45) formed from organic materials different from each other. The mixed layer ML can satisfy the weight ratio condition described above. The second embodiment will be described below with reference to FIG. 8. FIG. 8 is an enlarged view of the dotted line portion B in FIG. 1.

In an example shown in FIG. 8, an organic compound layer 4 includes a hole transport layer 41, the mixed layer ML, and an electron transport layer 43, and the mixed layer ML can function as a light emitting layer. In another example, the mixed layer ML can form the hole transport layer 41 and/or the electron transport layer 43. The mixed layer ML can include the first organic material layer 44 formed from a first organic material, and the second organic material layer 45 formed from a second organic material having a hole mobility lower than that of the first organic material. The first organic material layer 44 can include a first flat portion 441 located on an electrode region RE, and a first inclined portion 442 located on an inclined surface 31. The second organic material layer 45 can include a second flat portion 451 located on the electrode region RE, and a second inclined portion 452 located on the inclined surface 31. The first flat portion 441 and the second flat portion 451 can form a flat portion (first portion) 461. The first inclined portion 442 and the second inclined portion 452 can form an inclined portion (second portion) 462.

The ratio of the weight of the second organic material to the weight of the first organic material is higher in the inclined portion (second portion) 462 of the mixed layer ML on the inclined surface 31 than in the flat portion (first portion) 461 of the mixed layer ML on the electrode region RE. In an example, the thickness of the first flat portion 441 of the first organic material layer 44 is larger than the thickness of the first inclined portion 442 of the first organic material layer 44, and the thickness of the second flat portion 451 of the second organic material layer 45 is smaller than the thickness of the second inclined portion 452 of the second organic material layer 45. If the mixed layer ML satisfies the weight ratio condition described in the first embodiment, the effect similar to that in the first embodiment can be obtained in the second embodiment.

In another aspect, the ratio (t45/t44) of the film thickness (t45) (not shown) of the second organic material layer 45 to the film thickness (t44) (not shown) of the first organic material layer 44 is higher in the inclined portion 462 than in the flat portion 461. In this case as well, the effect similar to that in the first embodiment can be obtained.

A manufacturing method of a light emitting device 100 (electronic device) according to the second embodiment can include a step of forming the mixed layer ML using the vapor deposition apparatus exemplified in FIG. 4. In another aspect, the mixed layer ML of the light emitting device 100 according to the second embodiment can be formed using the vapor deposition apparatus exemplified in FIG. 4. The manufacturing method of the light emitting device 100 according to the second embodiment can include a first step and a second step. In the first step, a structure including a plurality of lower electrodes 2 arranged on a substrate 1 and an insulating layer 3 covering end portions EP of each of the plurality of lower electrodes 2 is prepared. In the second step, an organic compound layer is formed that covers the insulating layer 3 and the electrode region RE of the upper surface of each of the plurality of lower electrodes 2, the electrode region RE being located on the inner side of the end portion EP. In the second step, first, the structure prepared in the first step is arranged in the chamber of the vapor deposition apparatus exemplified in FIG. 4. In the second step, subsequently, the first organic material layer 44 can be formed using the first vapor deposition source 201 of the first vapor deposition source 201 and the second vapor deposition source 202, and then the second organic material layer 45 can be formed using the second vapor deposition source 202 of the first vapor deposition source 201 and the second vapor deposition source 202.

Specific Examples

Specific examples of the components of the light emitting device according to each of the first and second embodiments will be described below.

[Light Emitting Element]

The light emitting element 10 can be also understood to have an arrangement in which an anode, an organic compound layer, and a cathode are arranged on the element substrate 1 including the interlayer insulating layer on the outermost surface. In an example, the lower electrode 2 can be the anode, and the upper electrode 5 can be the cathode.

[Substrate]

The element substrate 1 can include a substrate such as quartz, glass, a silicon wafer, a resin, a metal, or the like. The element substrate 1 can include a switching element such as a transistor and a wiring arranged on the substrate, and the interlayer insulating layer arranged thereon. The interlayer insulating layer may be made of any material as long as a contact hole for ensuring electrical continuity between the anode (lower electrode) and the wiring can be formed and insulation from the unconnected wiring can be ensured. For example, a resin such as polyimide, silicon oxide, silicon nitride, or the like can be used. The interlayer insulating layer can be formed from, for example, an inorganic material such as silicon oxide (SiOx), silicon nitride (SiNx), silicon oxynitride (SION), or an organic material such as acryl or polyimide.

[Electrode]

The lower electrode 2 and the upper electrode 5 form a pair of electrodes. The pair of electrodes may be an anode and a cathode. When an electric field is applied in the direction in which the organic light emitting element emits light, the electrode having a high potential is the anode, and the other is the cathode. It can also be said that the electrode that supplies holes to the light emitting layer is the anode, and the electrode that supplies electrons is the cathode.

As the constituent material of the anode, a material having a work function as large as possible is preferable. For example, a metal such as gold, platinum, silver, copper, nickel, palladium, cobalt, selenium, vanadium, or tungsten, a mixture containing some of them, or an alloy obtained by combining some of them can be used. For example, a metal oxide such as tin oxide, zinc oxide, indium oxide, indium tin oxide (ITO), or zinc indium oxide can also be used. Furthermore, a conductive polymer such as polyaniline, polypyrrole, or polythiophene can also be used. One of these electrode materials may be used singly, or two or more of them may be used in combination. The anode may be formed by a single layer or a plurality of layers.

When the electrode is used as a reflective electrode, for example, chromium, aluminum, silver, titanium, tungsten, molybdenum, an alloy thereof, a stacked layer thereof, or the like can be used. When the electrode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function is preferable. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multi-layer structure. Among the above-described materials, silver is preferably used, and a silver alloy is more preferably used to suppress aggregation of silver. The ratio of the alloy is not limited as long as aggregation of silver can be suppressed. For example, the ratio may be 1:1.

The cathode may be a top emission element using an oxide conductive layer made of ITO or the like, or may be a bottom emission element using a reflective electrode made of aluminum (Al) or the like, and is not particularly limited. The method for forming the cathode is not particularly limited, but it is more preferable to use direct current sputtering or alternating current sputtering because the good film coverage is provided and the resistance is easily lowered with these methods.

[Protective Layer]

The protective layer 6 may be provided on the cathode. For example, by adhering glass provided with a moisture absorbing agent on the cathode, permeation of water or the like into the organic compound layer can be suppressed and occurrence of display defects can be suppressed. Further, as another embodiment, a passivation film made of silicon nitride or the like may be provided on the cathode to suppress permeation of water or the like into the organic EL layer. For example, after forming the cathode and transferring it into another chamber without breaking the vacuum, the protective layer may be formed by forming a silicon nitride film having a thickness of 2 μm by a CVD method. The protective layer may be provided using an atomic vapor deposition method (ALD method) after depositing a film using the CVD method.

[Color Filter]

The color filter 7 may be provided on the protective layer 6. For example, the color filter 7 considering the size of the organic light emitting element may be provided on another substrate, and may be bonded to the substrate with the organic light emitting element provided thereon. Alternatively, a color filter may be patterned on the protective layer described above using a photolithography technique. The color filter may be formed from a polymeric material.

[Planarizing Layer]

The planarizing layer 8 may be provided between the color filter 7 and the protective layer 6. The planarizing layer 8 may be formed from an organic compound. This may be a low-molecular material or a polymeric material, but is preferably a polymeric material. The planarizing layers 8 may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, urea resin, and the like.

[Counter Substrate]

A counter substrate may be provided on the planarizing layer. The counter substrate is called a counter substrate because it is provided at a position facing the above-described substrate. The constituent material of the counter substrate may be the same as that of the above-described substrate.

[Organic Compound Layer]

Organic layers (hole injection layer, hole transport layer, electron blocking layer, light emitting layer, hole blocking layer, electron transport layer, electron injection layer, and the like) forming the light emitting element according to an embodiment are formed by the method described below. The organic layer forming the light emitting element according to an embodiment can be formed by using a dry process such as a vacuum vapor deposition method, an ionization vapor deposition method, sputtering, or a plasma method. Instead of the dry process, a wet process in which a layer is formed by dissolving a solute in an appropriate solvent and using a well-known coating method (for example, spin coating, dipping, casting method, LB method, inkjet method, or the like) may be used. Here, when a layer is formed by a vacuum vapor deposition method, a solution coating method, or the like, crystallization or the like hardly occurs and an excellent temporal stability is obtained. Furthermore, when a film is formed using a coating method, it is possible to form the film while combining with a suitable binder resin.

Examples of the binder resin include polyvinyl carbazole resin, polycarbonate resin, polyester resin, ABS resin, acrylic resin, polyimide resin, phenol resin, epoxy resin, silicone resin, urea resin, and the like. These are examples, and the binder resin is not limited thereto. One of these binder resins may be used singly as a homopolymer or a copolymer, or two or more of them may be used in combination. Furthermore, additives, such as a well-known plasticizer, antioxidant, and an ultraviolet absorber, may also be used as needed.

(Application Examples of Electronic Device)

The electronic device according to each of the first and second embodiments can be used as a constituent part of a display apparatus or an illumination apparatus. In addition, the present invention is applicable to an exposure light source of an electrophotographic image forming apparatus, a backlight of a liquid crystal display apparatus, or the like.

The display apparatus may be an image information processing apparatus that includes an image input unit for inputting image information from an area CCD, a linear CCD, a memory card, or the like, and an information processing unit for processing the input information, and displays the input image on a display unit.

In addition, a display unit included in an image capturing apparatus or an inkjet printer may have a touch panel function. The driving type of the touch panel function may be an infrared type, a capacitance type, a resistive film type, or an electromagnetic induction type, and is not particularly limited. The display apparatus may be used for the display unit of a multifunction printer.

Figure 9:
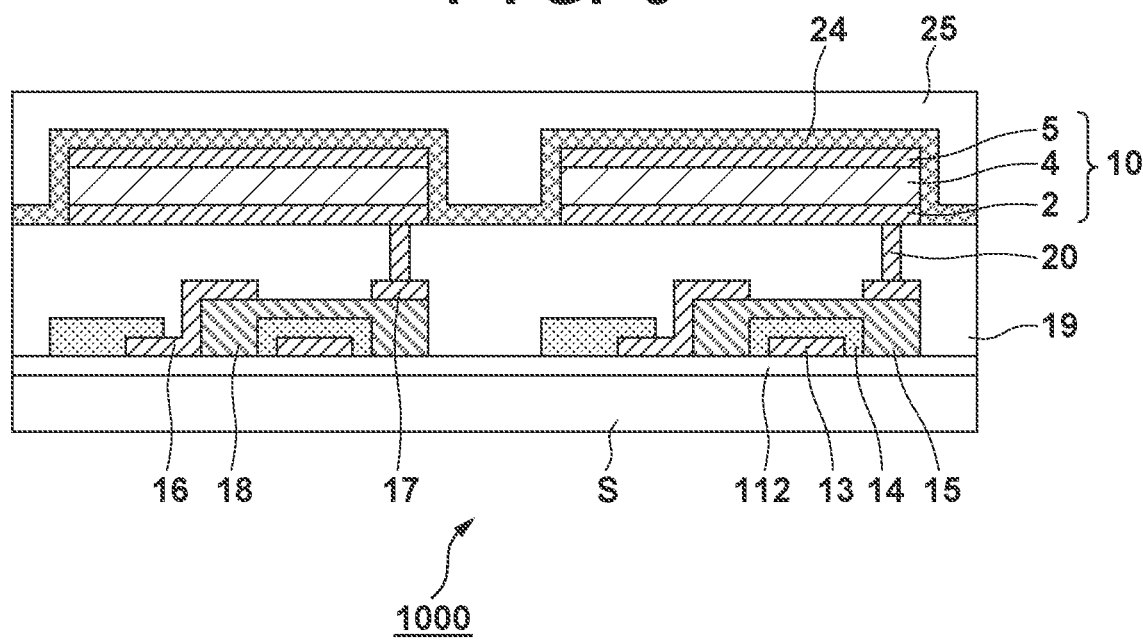
FIG. 9 is a schematic sectional view showing an example of a display apparatus according to the embodiment.

Next, the display apparatus according to this embodiment will be described with reference to the drawings. FIG. 9 is a schematic sectional view showing an example of the display apparatus including an organic light emitting device and a TFT element connected to the organic light emitting device. The TFT element is an example of an active element. A display apparatus 1000 shown in FIG. 9 includes a substrate S made of glass or the like, and a moisture-proof film 112 for protecting the TFT element or an organic compound layer on the substrate S. Reference numeral 13 denotes a metal gate electrode. Reference numeral 14 denotes a gate insulating film, and reference numeral 15 denotes a semiconductor layer. A TFT element 18 includes the semiconductor layer 15, a drain electrode 16, and a source electrode 17. An insulating film 19 is provided on the TFT element 18. The anode 2 forming the light emitting element is connected to the source electrode 17 via a contact hole 20.

Note that the method of electrical connection between the electrodes (anode and cathode) included in the organic light emitting element and the electrodes (source electrode and drain electrode) included in the TFT is not limited to that shown in FIG. 9. That is, it only needs that either the anode or the cathode is electrically connected to either the source electrode or the drain electrode of the TFT element. The organic layer is illustrated as one layer in the display apparatus 1000 shown in FIG. 9, but the organic compound layer 4 may include a plurality of layers. A first protective layer 24 and a second protective layer 25 for suppressing deterioration of the organic light emitting element are provided on the cathode.

In the display apparatus 1000 shown in FIG. 9, a transistor is used as a switching element, but a MIM element may be used as the switching element instead. The transistor used in the display apparatus 1000 shown in FIG. 9 is not limited to a transistor using a single-crystal silicon wafer, but may be a thin-film transistor having an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide. The thin-film transistor is also called a TFT element.

The transistor included in the display apparatus 1000 shown in FIG. 9 may be formed in a substrate such as an Si substrate. Here, being formed in a substrate means that a transistor is formed by processing the substrate itself such as an Si substrate. In other words, including a transistor in a substrate can be regarded as integrally forming the substrate and the transistor.

The light emission luminance of the light emitting element 10 is controlled by the TFT which is an example of a switching element, and the light emitting elements 10 are provided in a plurality of planes to display an image with the light emission luminance of the respective light emitting elements. Note that the switching element according to this embodiment is not limited to the TFT, but may be a transistor formed from low-temperature polysilicon or an active matrix driver formed on the substrate such as an Si substrate. The term "on the substrate" may mean "in the substrate". Whether to provide a transistor or a TFT in the substrate is selected based on the size of the display unit. For example, if the size is about 0.5 inch, it is preferable to provide the light emitting element on the Si substrate.

FIG. 10 is a view schematically showing an example of the display apparatus according to this embodiment. The display apparatus 1000 may include, between an upper cover 1001 and a lower cover 1009, a touch panel 1003, an electronic device 1005 formed as a display panel, a frame 1006, a circuit board 1007, and a battery 1008. The touch panel 1003 and the electronic device 1005 are connected to flexible printed circuit FPCs 1002 and 1004, respectively. Transistors are printed on the circuit board 1007. The battery 1008 may not be provided if the display apparatus is not a portable equipment, or may be provided in another position even if the display apparatus is a portable equipment.

The display apparatus according to this embodiment may be used for a display unit of an image capturing apparatus that includes an optical unit including a plurality of lenses and an image sensor that receives light passing through the optical unit. The image capturing apparatus may include the display unit that displays information acquired by a plurality of image sensors included in an image capturing unit. Alternatively, information may be acquired using the information acquired by the image sensor, and the display unit may display the information different from the information acquired by the image sensor.

The imaging sensor may be a photoelectronic conversion element obtained by replacing the organic compound layer of the electronic device according to each of the first and second embodiments with a photoelectronic conversion layer. In this case, the image capturing apparatus includes a plurality of the photoelectronic conversion elements in the image capturing unit. The display unit may be a display unit exposed to the outside of the image capturing apparatus, or a display unit arranged in a viewfinder. The image capturing apparatus may be a digital camera or a digital video camera.

Figure 11A:
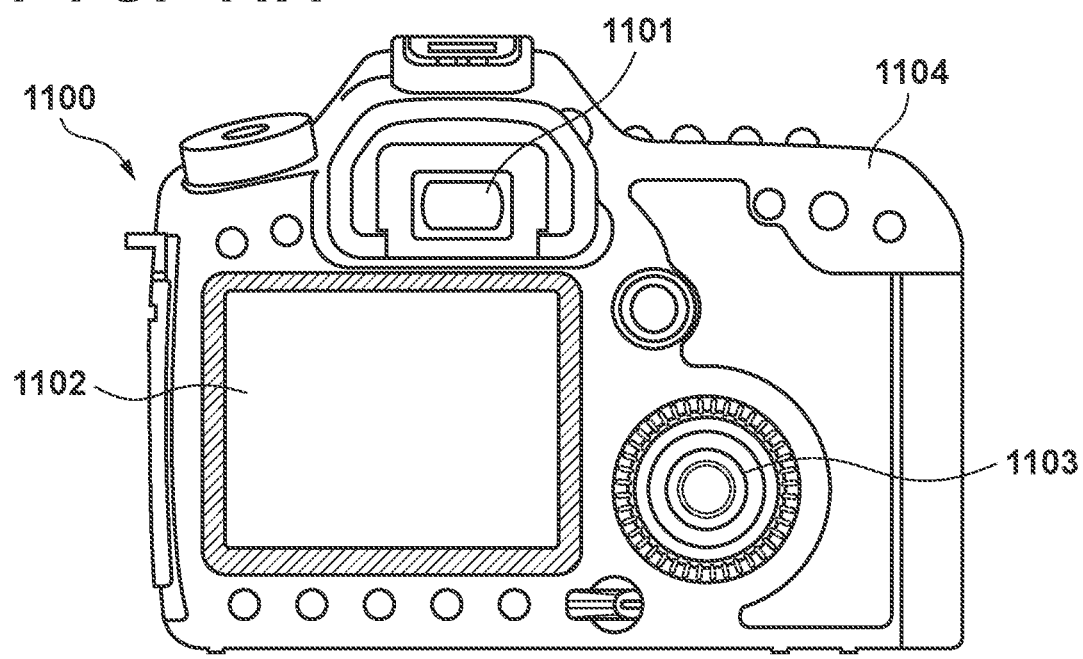
FIG. 11A is a schematic view showing an example of an image capturing apparatus.

FIG. 11A is a view schematically showing an example of an image capturing apparatus according to this embodiment. An image capturing apparatus 1100 may include a viewfinder 1101, a rear display 1102, an operation unit 1103, and a housing 1104. The viewfinder 1101 can include the light emitting device 100 configured as a display apparatus. In this case, the display apparatus may display not only an image to be captured, but also environment information, an image capturing instruction, and the like. The environment information may include the intensity of ambient light, the direction of ambient light, the moving speed of an object, the possibility that the object is blocked by a shielding object, or the like.

Since the timing suitable for capturing an image is a short time, it is preferable to display the information as quickly as possible. Therefore, it is preferable to use the display apparatus using the organic light emitting element of the present invention. This is because the organic light emitting element has a high response speed. The display apparatus using the organic light emitting element can be used more suitably than a liquid crystal display apparatus in the apparatuses that require a high display speed.

The image capturing apparatus 1100 includes an optical unit (not shown). The optical unit includes a plurality of lenses and forms an image on an image sensor housed in the housing 1104. It is possible to adjust the focus by adjusting the relative positions of the plurality of lenses. This operation can be performed automatically. The display apparatus according to this embodiment may include a color filter having red, green, and blue colors. In the color filter, the red, green, and blue colors may be arranged in a delta arrangement. The display apparatus according to this embodiment may be used for the display unit of a mobile terminal. In this case, both a display function and an operation function may be provided. Examples of the mobile terminal include a mobile phone such as a smartphone, a tablet, and a head mounted display.

Figure 11B:
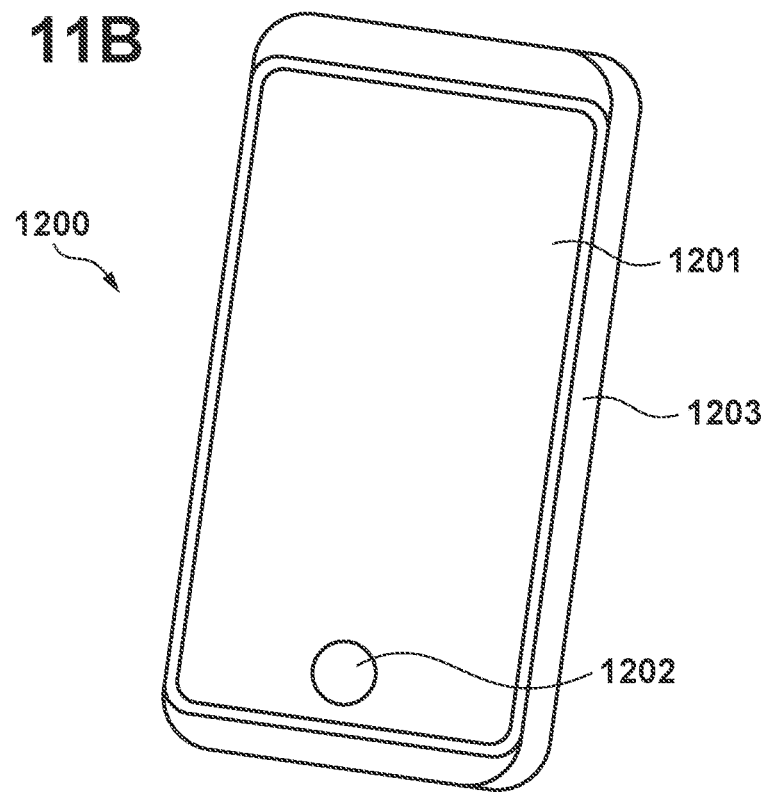
FIG. 11B is a schematic view showing an example of an electronic apparatus according to the embodiment.

FIG. 11B is a view schematically showing an example of an electronic equipment according to this embodiment. An electronic equipment 1200 includes a display unit 1201, an operation unit 1202, and a housing 1203. The light emitting device 100 can be applied to the display unit 1201. The housing 1203 may include a circuit, a printed board including the circuit, a battery, and a communication unit. The operation unit 1202 may be a button or a touch panel type sensing unit. The operation unit may be a biometrics unit that recognizes a fingerprint and releases a lock or the like. An electronic equipment including a communication unit can also be called a communication equipment.

Figure 12A:
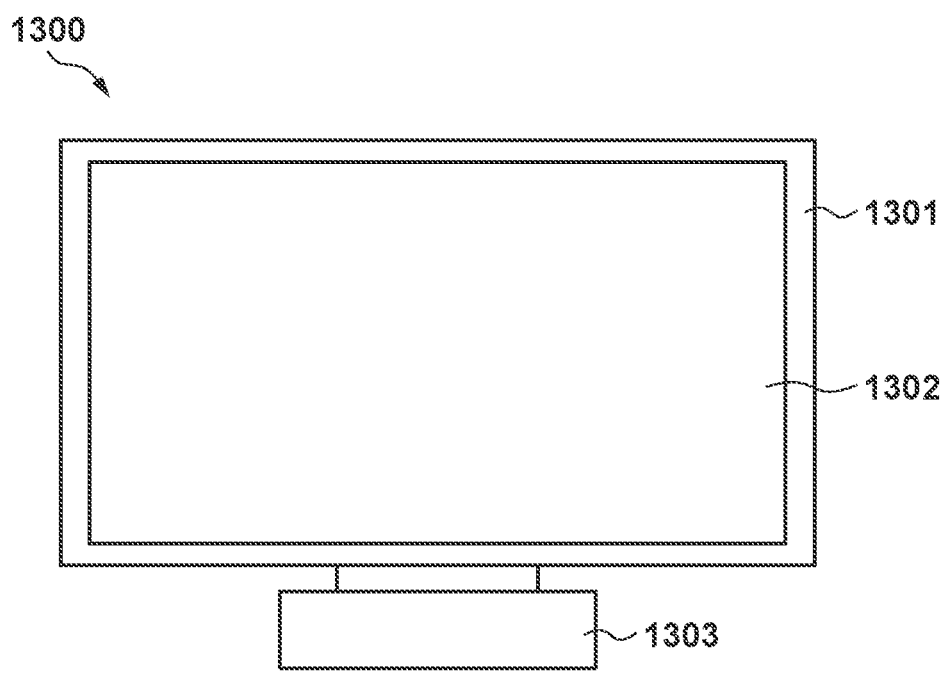
FIG. 12A is a schematic view showing another example of the display apparatus according to the embodiment.
Figure 12B:
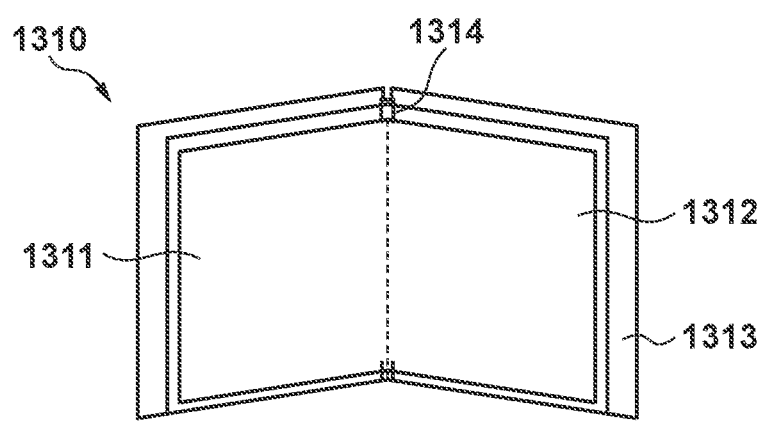
FIG. 12B is a schematic view showing an example of a foldable display apparatus.

FIGS. 12A and 12B are views schematically showing examples of the display apparatus according to this embodiment. FIG. 12A shows a display apparatus such as a television monitor or a PC monitor. A display apparatus 1300 includes a frame 1301 and a display unit 1302. The light emitting device 100 can be applied to the display unit 1302. The display apparatus 1300 includes a base 1303 that supports the frame 1301 and the display unit 1302. The base 1303 is not limited to the form shown in FIG. 12A. The lower side of the frame 1301 may serve as the base. The frame 1301 and the display unit 1302 may be bent. The curvature radius may be between 5,000 mm (inclusive) and 6,000 mm (inclusive).

FIG. 12B is a view schematically showing another example of the display apparatus according to this embodiment. A display apparatus 1310 shown in FIG. 12B is configured to be bendable, and is a so-called foldable display apparatus. The display apparatus 1310 includes a first display unit 1311, a second display unit 1312, a housing 1313, and a bending point 1314. The light emitting device 100 can be applied to each of the first display unit 1311 and the second display unit 1312. The first display unit 1311 and the second display unit 1312 may be one seamless display apparatus. The first display unit 1311 and the second display unit 1312 can be divided at the bending point. The first display unit 1311 and the second display unit 1312 may display different images, or one image may be displayed with the first and second display units.

Figure 13A:
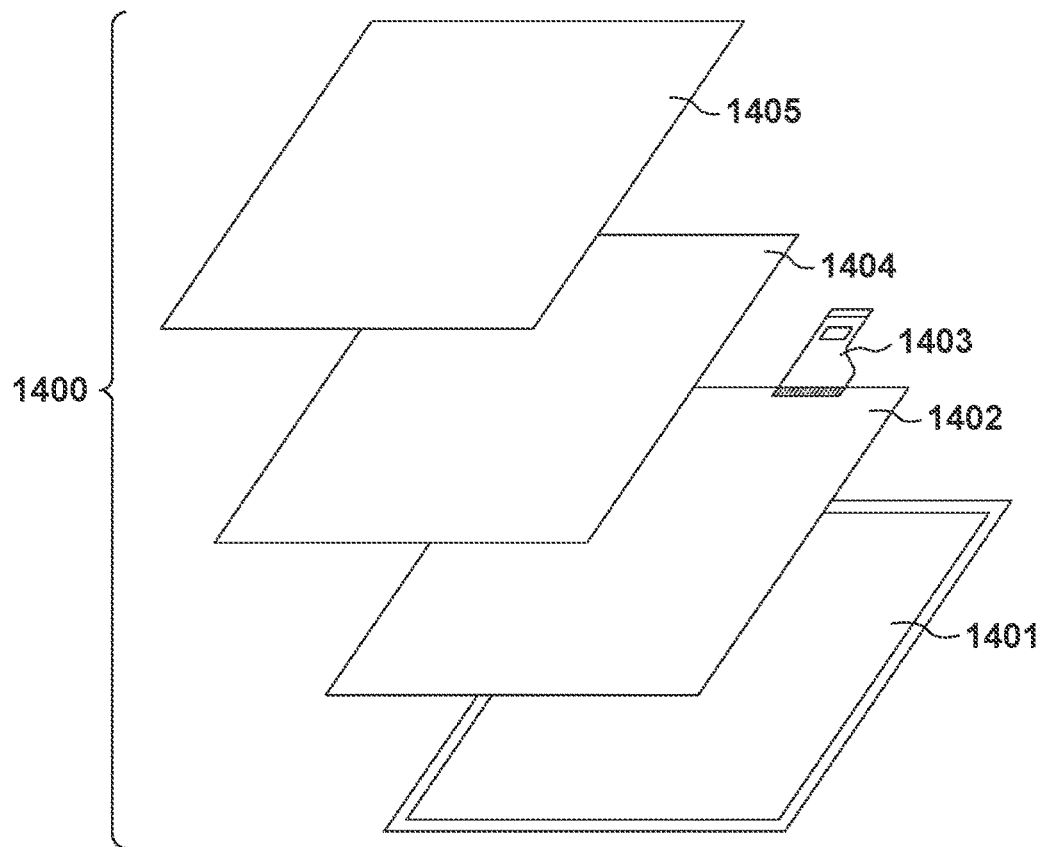
FIG. 13A is a schematic view showing an example of an illumination apparatus according to the embodiment.

FIG. 13A is a view schematically showing an example of an illumination apparatus according to this embodiment. An illumination apparatus 1400 may include a housing 1401, a light source 1402, a circuit board 1403, an optical film 1404, and a light diffusion unit 1405. The light emitting device 100 can be applied to the light source 1402. The optical filter may be a filter that improves the color rendering property of the light source. The light diffusion unit can effectively diffuse light from the light source to illuminate a wide range for lighting up or the like. The optical filter and the light diffusion unit may be provided on the illumination light emission side. A cover may be provided in the outermost portion, as needed.

The illumination apparatus is, for example, an apparatus that illuminates a room. The illumination apparatus may emit light of white, day white, or any other color from blue to red. A light control circuit for controlling the light color may be provided. The illumination apparatus may include the organic light emitting element according to the present invention and a power supply circuit connected thereto. The power supply circuit is a circuit that converts an AC voltage into a DC voltage. Note that white light has a color temperature of 4200K, and day-white light has a color temperature of 5000K. The illumination apparatus may include a color filter. Further, the illumination apparatus according to this embodiment may include a heat dissipation portion. The heat dissipation portion releases the heat in the apparatus to the outside of the device, and examples thereof include a metal having high specific heat, liquid silicon, and the like.

Figure 13B:
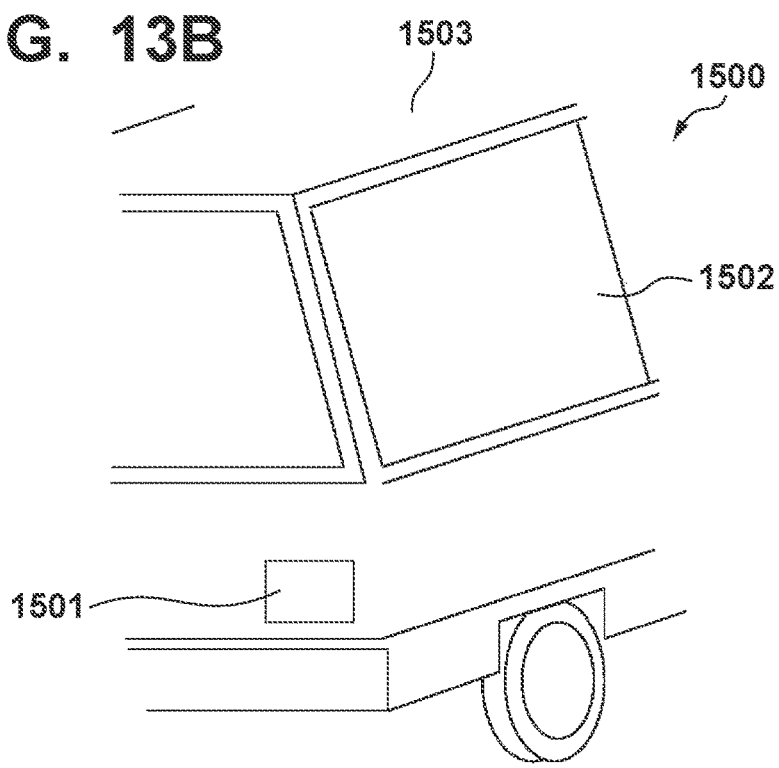
FIG. 13B is a schematic view showing an example of an automobile including a vehicle lighting unit according to the embodiment.

FIG. 13B is a view schematically showing an automobile which is an example of a moving body according to this embodiment. The automobile includes a tail lamp which is an example of the lighting unit. An automobile 1500 includes a tail lamp 1501, and may turn on the tail lamp when a brake operation or the like is performed. The light emitting device 100 can be applied to the tail lamp 1501. The tail lamp may include a protective member that protects the light emitting element. The protective member has a certain degree of strength, and can be made from any material as long as it is transparent, but is preferably made from polycarbonate or the like. Furandicarboxylic acid derivative, acrylonitrile derivative, or the like may be mixed with polycarbonate.

The automobile 1500 may include a body 1503 and windows 1502 attached thereto. The window may be a transparent display as long as it is not a window for checking the front or rear of the automobile. The light emitting device 100 can be applied to the transparent display. In this case, the components such as the electrodes included in the organic light emitting element are formed by transparent members. The moving body according to this embodiment may be a ship, an aircraft, a drone, or the like. The moving body may include a body and a lighting unit provided in the body. The lighting unit may emit light to inform the position of the body. The light emitting device 100 can be applied to the lighting unit.

Application examples of the display apparatus according to the embodiments described above will be described with reference to FIGS. 14A and 14B. The display apparatus is applicable to, for example, a system that can be worn as a wearable device such as smart glasses, an HMD, smart contact lenses, or the like. An image capturing/display apparatus that is used in such an application example includes an image capturing apparatus that can photoelectrically convert visible light and a display apparatus that can emit visible light.

Figure 14A:
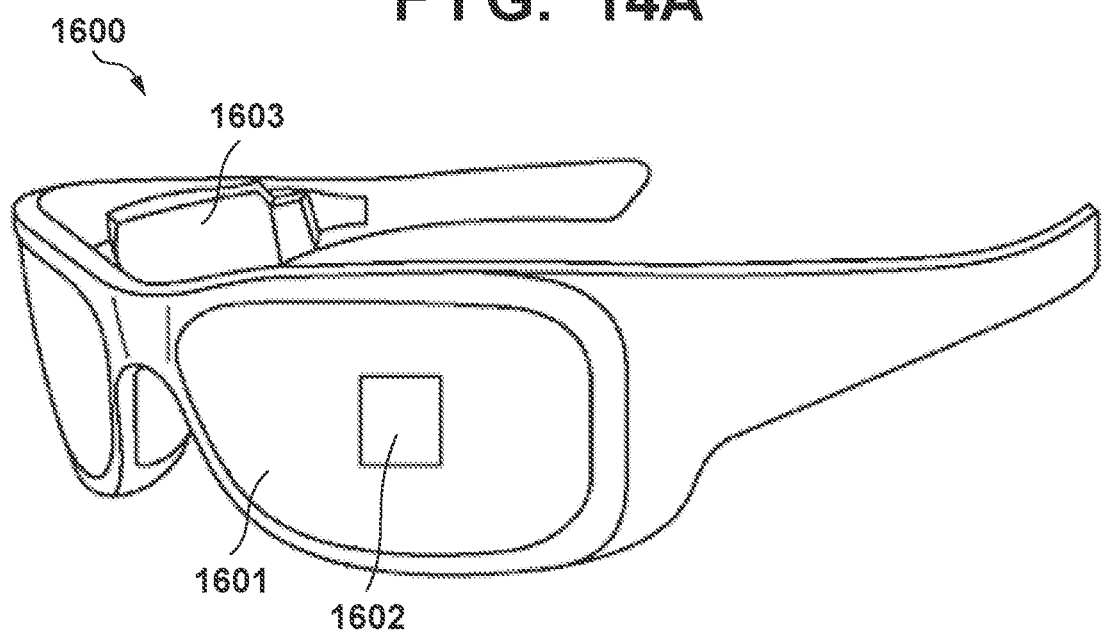
FIGS. 14A and 14B are views each showing an electronic apparatus according to the embodiment.

FIG. 14A illustrates a pair of glasses 1600 (smart glasses) according to an application example. An image capturing apparatus 1602 such as a CMOS sensor or an SPAD is arranged on the front surface side of a lens 1601 of the glasses 1600. Also, the display apparatus with the light emitting device 100 applied thereto is arranged on the back surface side of the lens 1601.

The pair of glasses 1600 further includes a control apparatus 1603. The control apparatus 1603 functions as a power supply that supplies power to the image capturing apparatus 1602 and the display apparatus according to the embodiments. The control apparatus 1603 controls the operation of the image capturing apparatus 1602 and the operation of the display apparatus. An optical system for focusing light to the image capturing apparatus 1602 is formed on the lens 1601.

Figure 14B:
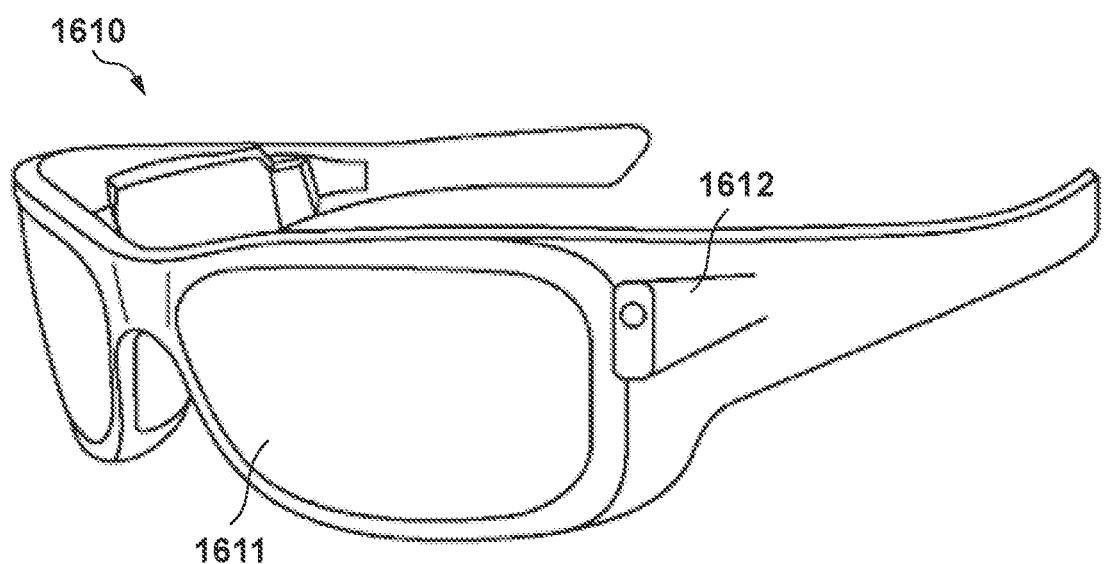

FIG. 14B illustrates a pair of glasses 1610 (smart glasses) according to another application example. The pair of glasses 1610 includes a control apparatus 1612, and an image capturing apparatus corresponding to the image capturing apparatus 1602 and a display apparatus are incorporated in the control apparatus 1612. An optical system for projecting light emitted from the image capturing apparatus and the display apparatus in the control apparatus 1612 is formed in the control apparatus 1612, and an image is projected onto the lens 1611. In addition to functioning as a power supply that supplies power to the image capturing apparatus and the display apparatus, the control apparatus 1612 also controls the operation of the image capturing apparatus and the operation of the display apparatus. The control apparatus may also include a line-of-sight detection unit that detects the line of sight of a wearer. Infrared light can be used for the line-of-sight detection. An infrared light emitting unit emits infrared light to the eyeball of a user who is gazing at a displayed image. When the emitted infrared light is reflected by the eyeball and detected by an image capturing unit including a light receiving element, a captured image of the eyeball can be obtained. Image quality degradation is reduced by providing a reduction means that reduces the light from the infrared light emitting unit to the display unit in a planar view.

The line of sight of the user to the displayed image is detected from the captured image of the eyeball obtained by the image capturing operation using the infrared light. A known method can be arbitrarily applied for the line-of-sight detection using the captured eyeball image. As an example, a line-of-sight detection method based on Purkinje images caused by the reflection of the emitted light on the cornea can be used.

More specifically, line-of-sight detection processing is performed based on a pupil-cornea reflection method. The line of sight of the user is detected by using the pupil-cornea reflection method to calculate a line-of-sight vector representing the direction (rotation angle) of the eyeball based on the image of the pupil and the Purkinje images included in the captured image of the eyeball.

A display apparatus according to one embodiment of the present invention may include an image capturing apparatus including a light receiving element, and control a displayed image on the display apparatus based on the line-of-sight information of the user obtained from the image capturing apparatus.

More specifically, in the display apparatus, a first field-of-view region which is gazed by the user and a second field-of-view region other than the first field-of-view region are determined based on the line-of-sight information. The first field-of-view region and the second field-of-view region may be determined by a control apparatus of the display apparatus. Alternatively, the first field-of-view region and the second field-of-view region may be determined by an external control apparatus and the display apparatus may receive information corresponding to this determination. Control can be performed in the display region of the display apparatus so that the display resolution of the first field-of-view region will be higher than the display resolution of the second field-of-view region. That is, the resolution of the second field-of-view region may be lowered more than the resolution of the first field-of-view region.

In addition, the display region includes a first display region and a second display region different from the first display region, and a region with a high degree of priority is determined from the first display region and the second display region of the display region based on the line-of-sight information. The first display region and the second display region may be determined by the control apparatus of the display apparatus. Alternatively, the first display region and the second display region may be determined by an external control apparatus and the display apparatus may receive information corresponding to this determination. Control may be performed so that the resolution of a region with the high degree of priority will be set higher than the resolution of a region other than the region with the high degree of priority. That is, the resolution of a region with a relatively low degree of priority can be set low.

Note that an AI may be used for the determination of the first field-of-view region and the region with the high degree of priority. The AI may be a model configured to estimate, from an image of the eyeball, the angle of the line of sight and the distance to an object as the target of the gaze by using the image of the eyeball and the direction actually gazed by the eyeball of the image as the teaching data. The display apparatus, the image capturing apparatus, or an external apparatus may include the AI program. If the AI program is included in an external apparatus, information determined by the AI program will be transmitted to the display apparatus by communication.

In a case in which display control is to be performed based on visual recognition detection, the display apparatus according to the embodiments can be preferably applied to a pair of smart glasses that further includes an image capturing apparatus configured to capture the outside. The smart glasses can display the captured external information in real time.

As has been described above, by using the apparatus using the organic light emitting element according to this embodiment, it is possible to perform stable display even for a long-time display with good image quality.

Preferred embodiments of the present invention have been described above. However, the present invention is not limited to these embodiments, and various changes and modifications can be made within the spirit and scope of the present invention.

According to the present invention, there is provided a technique advantageous in, in an electronic device including a plurality of lower electrodes, suppressing a leak current between an upper electrode and the lower electrode and suppressing a leak current between adjacent light emitting elements.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-058311, filed Mar. 27, 2020, which is hereby incorporated by reference herein in its entirety.

What is claimed is:

1. An electronic device comprising a plurality of lower electrodes, an insulating layer covering an end portion of each of the plurality of lower electrodes, an organic compound layer covering the insulating layer and an electrode region of an upper surface of each of the plurality of lower electrodes, and an upper electrode covering the organic compound layer, the electrode region of the upper surface being located on an inner side of the end portion,
wherein the organic compound layer includes a mixed layer, and the mixed layer contains a first organic material and a second organic material having a hole mobility lower than a hole mobility of the first organic material,
the insulating layer includes an inclined surface inclined with respect to the upper surface of the lower electrode, and
a ratio of a weight of the second organic material to a weight of the first organic material is higher in a second portion of the mixed layer on the inclined surface than in a first portion of the mixed layer on the electrode region.

2. The device according to claim 1, wherein the mixed layer is a layer in which the first organic material and the second organic material are mixed.

3. The device according to claim 2, wherein the mixed layer is a co-vapor-deposited layer formed from the first organic material and the second organic material.

4. The device according to claim 1, wherein the mixed layer includes a first organic material layer formed from the first organic material and a second organic material layer formed from the second organic material, and
a ratio of a film thickness of the second organic material layer to a film thickness of the first organic material layer is higher in the second portion than in the first portion.

5. The device according to claim 1, wherein the mixed layer is a hole transport layer.

6. The device according to claim 1, wherein the mixed layer includes an electric charge generating layer.

7. The device according to claim 1, wherein a weight of the first organic material is larger than a weight of the second organic material in the first portion of the mixed layer on the electrode region.

8. The device according to claim 1, wherein
a weight of the first organic material is smaller than a weight of the second organic material in the second portion of the mixed layer on the inclined surface.

9. The device according to claim 1, wherein
in the mixed layer, a HOMO (Highest Occupied Molecular Orbital) level of the second organic material is lower than the HOMO level of the first organic material.

10. The device according to claim 1, wherein
in the second portion, a percent concentration of mass of the first organic material is not less than 1% and not more than 30%.

11. The device according to claim 1, wherein
in the second portion, a HOMO level of the first organic material is higher than the HOMO level of the second organic material, and a difference between the HOMO level of the first organic material and the HOMO level of the second organic material is not less than 0.15 eV.

12. An electronic apparatus comprising:
an image capturing unit configured to capture an object; and
an electronic device defined in claim 1, configured to display an image based on data from the image capturing unit.

13. A moving body comprising:
an image capturing unit configured to capture an object; and
an electronic device defined in claim 1, configured to display an image based on data from the image capturing unit.

14. An electronic device comprising a plurality of lower electrodes, an insulating layer covering an end portion of each of the plurality of lower electrodes, an organic compound layer covering the insulating layer and an electrode region of an upper surface of each of the plurality of lower electrodes, the electrode region being located on an inner side of the end portion, and an upper electrode covering the organic compound layer,
wherein the organic compound layer includes a first organic material layer formed from a first organic material and a second organic material layer formed from a second organic material having a hole mobility lower than a hole mobility of the first organic material,
the insulating layer includes an inclined surface inclined with respect to the upper surface of the lower electrode, and
a ratio of a film thickness of the second organic material layer to a film thickness of the first organic material layer is higher in a second portion on the inclined surface than in a first portion on the electrode region.

15. An electronic apparatus comprising:
an image capturing unit configured to capture an object; and
an electronic device defined in claim 14, configured to display an image based on data from the image capturing unit.

16. A moving body comprising:
an image capturing unit configured to capture an object; and
an electronic device defined in claim 14, configured to display an image based on data from the image capturing unit.

* * * * *